(12) United States Patent
Ohba

(10) Patent No.: US 8,969,843 B2
(45) Date of Patent: Mar. 3, 2015

(54) MEMORY DEVICE

(71) Applicant: Kabushiki Kaisha Toshiba, Minato-ku (JP)

(72) Inventor: Ryuji Ohba, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 94 days.

(21) Appl. No.: 13/904,337

(22) Filed: May 29, 2013

(65) Prior Publication Data

US 2014/0231740 A1 Aug. 21, 2014

Related U.S. Application Data

(60) Provisional application No. 61/767,401, filed on Feb. 21, 2013.

(51) Int. Cl.
*H01L 45/00* (2006.01)

(52) U.S. Cl.
CPC ........................ *H01L 45/12* (2013.01)
USPC ................ 257/2; 257/E45.001; 257/E45.002; 257/E45.003

(58) Field of Classification Search
CPC ........ H01L 45/08; H01L 45/085; H01L 45/12
USPC ........................... 257/2–5, E45.001–E45.003
See application file for complete search history.

(56) References Cited

U.S. PATENT DOCUMENTS

| | | | |
|---|---|---|---|
| 7,266,012 B2 * | 9/2007 | Saito et al. | 365/158 |
| 7,283,407 B2 * | 10/2007 | Inoue et al. | 365/189.11 |
| 7,332,765 B2 * | 2/2008 | Iwata et al. | 257/314 |
| 7,462,857 B2 * | 12/2008 | Arai et al. | 257/2 |
| 7,907,436 B2 | 3/2011 | Maejima et al. | |
| 8,587,050 B2 * | 11/2013 | Ohba | 257/315 |
| 2003/0234449 A1 | 12/2003 | Aratani et al. | |
| 2005/0162881 A1 | 7/2005 | Stasiak et al. | |
| 2008/0232160 A1 | 9/2008 | Gopalakrishnan | |
| 2011/0260131 A1 | 10/2011 | Sonehara | |
| 2012/0061746 A1 | 3/2012 | Ohba | |
| 2013/0082319 A1 | 4/2013 | Ohba | |
| 2014/0213032 A1 * | 7/2014 | Kai et al. | 438/382 |

FOREIGN PATENT DOCUMENTS

| | | |
|---|---|---|
| JP | 2004-6579 | 1/2004 |
| JP | 2005-217402 | 8/2005 |
| JP | 2006-196601 | 7/2006 |
| JP | 2010-206008 | 9/2010 |
| JP | 2011-228522 | 11/2011 |
| JP | 2013-77603 | 4/2013 |

* cited by examiner

*Primary Examiner* — Allison P Bernstein
(74) *Attorney, Agent, or Firm* — Oblon, McClelland, Maier & Neustadt, L.L.P.

(57) ABSTRACT

According to one embodiment, a memory device includes first and second conductive layers, a variable resistance portion, and a multiple tunnel junction portion. The variable resistance portion is provided between the first and second conductive layers. The multiple tunnel junction portion is provided between the first conductive layer and the variable resistance portion, and includes first, second, and third tunnel insulating films, and first and second nanocrystal layers. The first nanocrystal layer between the first and second tunnel insulating films includes first conductive minute particles. The second nanocrystal layer between the second and third tunnel insulating films includes second conductive minute particles.

21 Claims, 17 Drawing Sheets

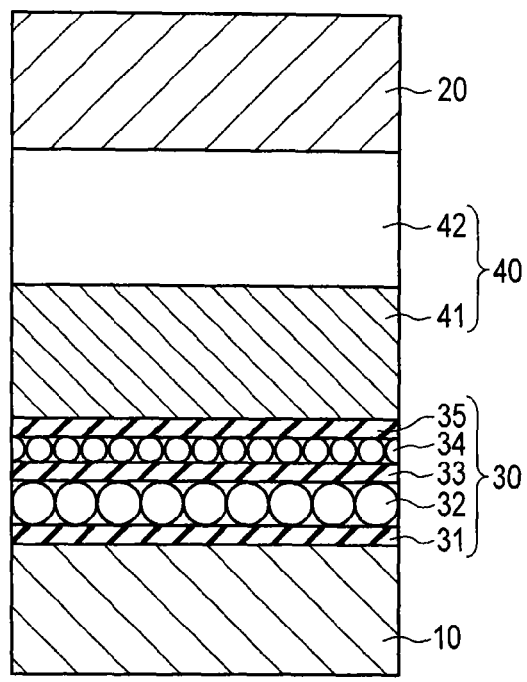
F I G. 1
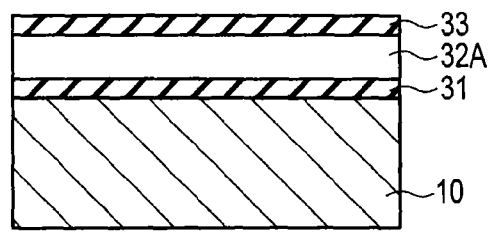
F I G. 2A
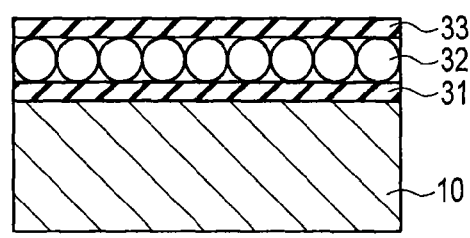
F I G. 2B

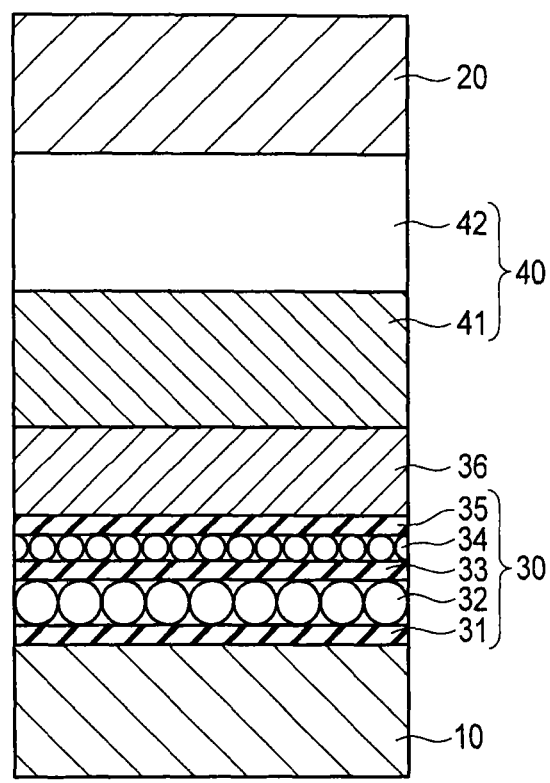
F I G. 6

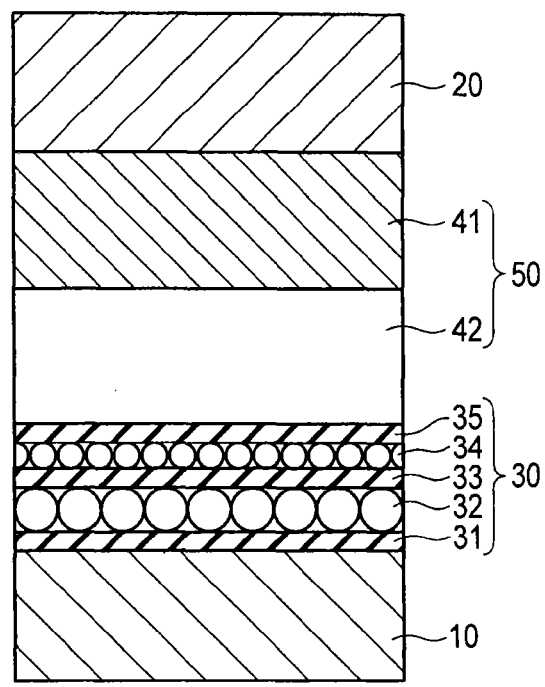
F I G. 8
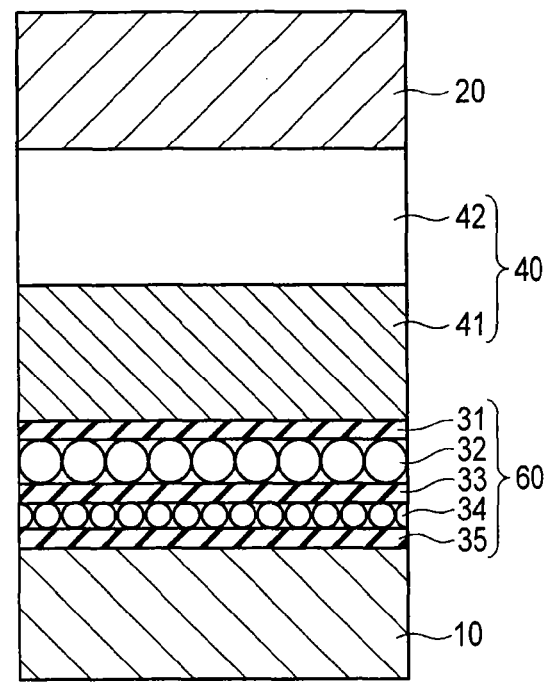
F I G. 9

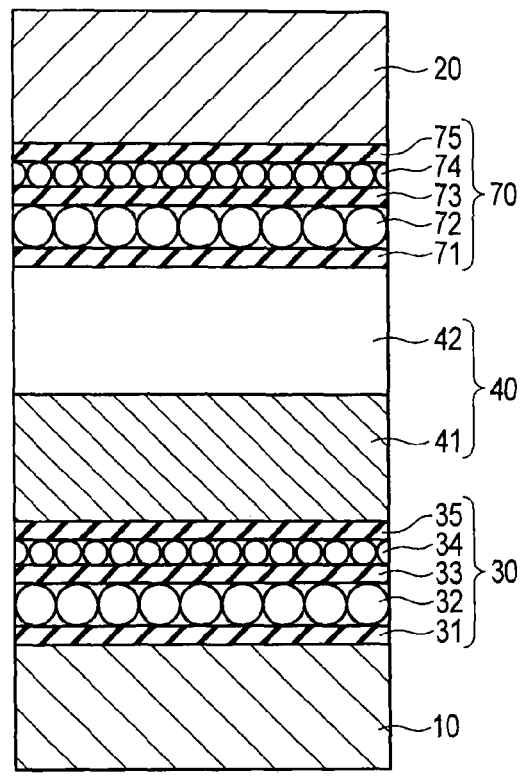
F I G. 10
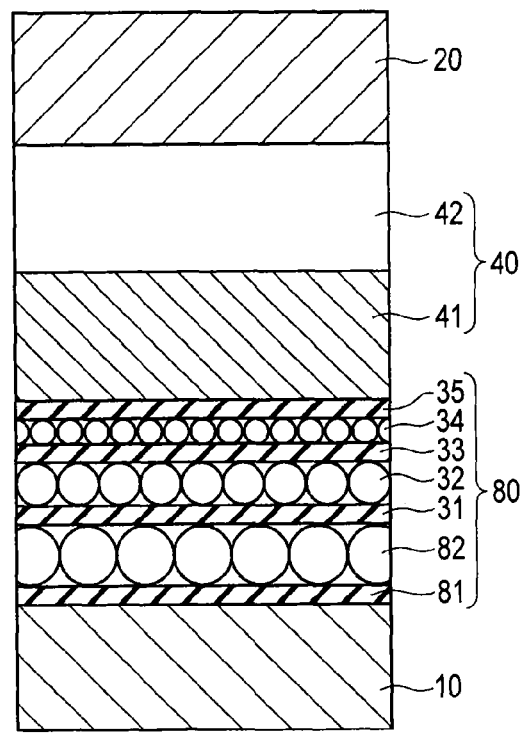
F I G. 11

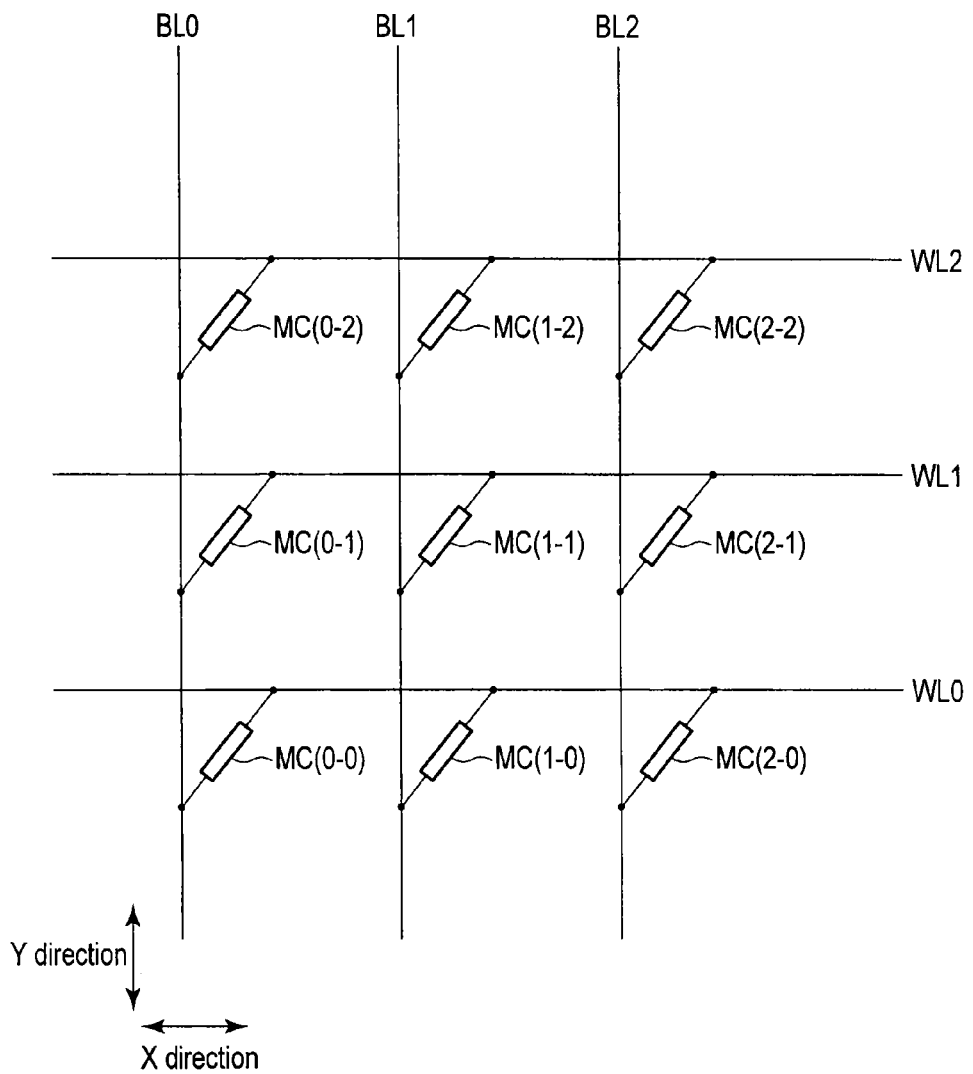
F I G. 17

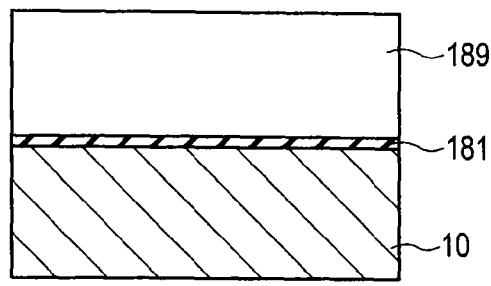
F I G. 18A
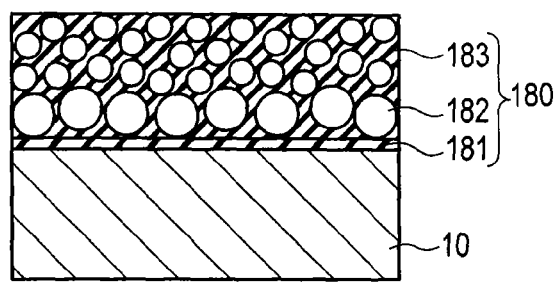
F I G. 18B
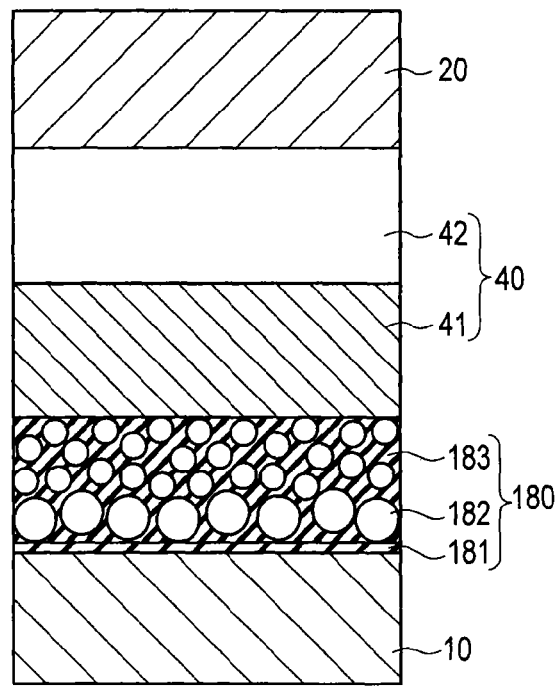
F I G. 18C

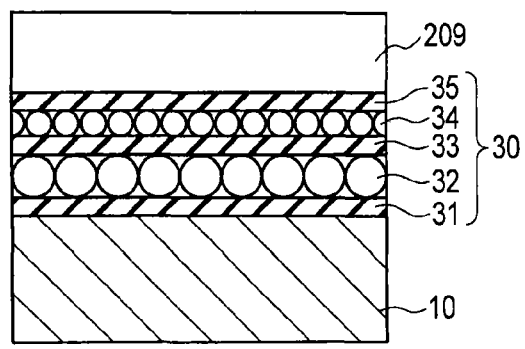
F I G. 20A
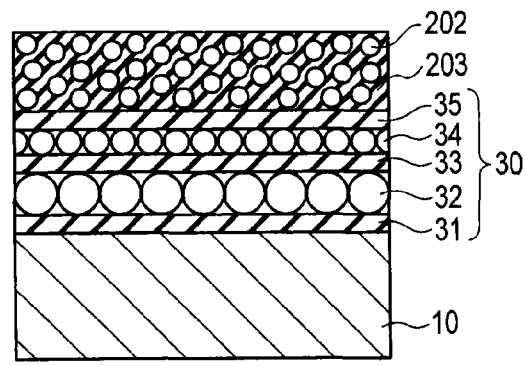
F I G. 20B
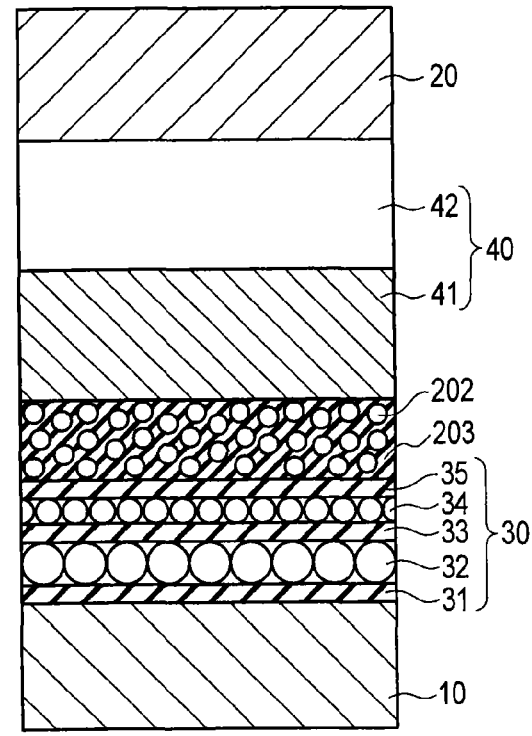
F I G. 20C

MEMORY DEVICE

CROSS-REFERENCE TO RELATED APPLICATIONS

This application claims the benefit of U.S. Provisional Application No. 61/767,401, filed Feb. 21, 2013, the entire contents of which are incorporated herein by reference.

FIELD

Embodiments described herein relate generally to a memory device which includes a memory element including two terminals.

BACKGROUND

Conventional memory elements that include two terminals include two conductive layers, and a variable resistance portion provided between the two conductive layers. The memory elements are capable of reversibly changing the resistance of the variable resistance portion by applying proper voltage stress between the two conductive layers, and can operate as memory.

The conventional memory elements requires, however, the variable resistance portion to perform writing and erasing of data, which change the resistance between the two terminals, storage of memory in the ON state or OFF state, a rectifying function in the forward direction and the reverse direction of the bias voltage, and control of the voltage and the current in each operating state.

BRIEF DESCRIPTION OF THE DRAWINGS

FIG. 1 is a cross-sectional view illustrating a structure of a memory device according to a first embodiment.

FIGS. 2A, 2B, 3A, and 3B are cross-sectional views illustrating a method of manufacturing the memory device according to the first embodiment.

FIG. 6 is a cross-sectional view illustrating a structure of a memory device according to a modification of the first embodiment.

FIG. 8 is a cross-sectional view illustrating a structure of a memory device according to a third embodiment.

FIG. 9 is a cross-sectional view illustrating a structure of a memory device according to a fourth embodiment.

FIG. 10 is a cross-sectional view illustrating a structure of a memory device according to a fifth embodiment.

FIG. 11 is a cross-sectional view illustrating a structure of a memory device according to a sixth embodiment.

FIG. 17 is a circuit diagram illustrating a structure of a cross-point memory according to a ninth embodiment.

FIGS. 18A and 18B are cross-sectional views illustrating a method of manufacturing a memory device according to a tenth embodiment, and FIG. 18C is a cross-sectional view illustrating a structure of the memory device according to the tenth embodiment.

FIGS. 20A and 20B are cross-sectional views illustrating a method of manufacturing a memory device according to a twelfth embodiment, and FIG. 20C is a cross-sectional view illustrating a structure of the memory device according to the twelfth embodiment.

DETAILED DESCRIPTION

Figure 3A:
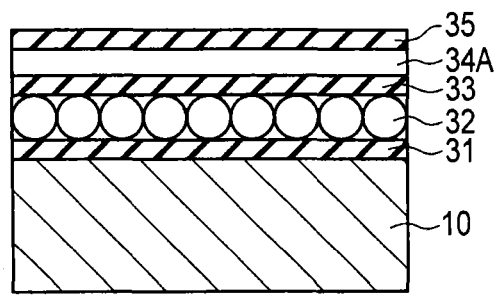

Memory devices according to embodiments will be explained hereinafter with reference to drawings. In the following explanation, constituent elements having the same function and structure will be denoted by the same reference number, and overlapping explanation will be made only when necessary.

In general, according to one embodiment, a memory device includes a first conductive layer, a second conductive layer, a variable resistance portion and a first multiple tunnel junction portion. The variable resistance portion is provided between the first conductive layer and the second conductive layer, and has one of a low-resistance state and a high-resistance state. The first multiple tunnel junction portion is provided between the first conductive layer and the variable resistance portion, and includes first, second, and third tunnel insulating films, a first nanocrystal layer and a second nanocrystal layer. The first nanocrystal layer is provided between the first and second tunnel insulating films and includes first conductive minute particles. The second nanocrystal layer is provided between the second and third tunnel insulating films and includes second conductive minute particles.

[First Embodiment]

A memory device of a first embodiment will be explained hereinafter.

[1] Structure of Memory Device

FIG. 1 is a cross-sectional view illustrating a structure of a memory device according to the first embodiment.

As illustrated in FIG. 1, the memory device includes first and second conductive layers, for example, n+ polysilicon interconnects (or electrodes) 10 and 20, an asymmetric multiple tunnel junction portion 30, and a variable resistance portion 40. The variable resistance portion 40 is disposed between the polysilicon interconnects 10 and 20. The multiple tunnel junction portion 30 is disposed between the polysilicon interconnect 10 and the variable resistance portion 40.

The variable resistance portion 40 is a resistance change element which has one of a low-resistance state (ON state) and a high-resistance state (OFF state) by application of a voltage. For example, the variable resistance portion 40 includes a conductive-bridge element or a variable resistive element. The present embodiment shows an example in which the variable resistance portion 40 is the conductive-bridge element. Specifically, the variable resistance portion 40 includes a diffused metal layer 41 and a resistance change layer 42. The diffused metal layer 41 is a layer which is capable of supplying diffused metal, such as nickel, silver, copper, and zinc, to the resistance change layer 42 in abundance, and formed of a compound including the diffused metal and a chalcogenide element. The resistance change layer 42 is formed of a metal oxide, such as an amorphous silicon film, a silicon rich oxide film, and aluminum oxide.

The multiple tunnel junction portion 30 includes a plurality of tunnel insulating films, and nanocrystal layers which are disposed between the tunnel insulating films and include conductive minute particles. The present embodiment shows an example in which the multiple tunnel junction portion 30 has a triple tunnel junction structure that includes first, second, and third tunnel insulating films, for example, silicon oxide films 31, 33, and 35, a first nanocrystal layer 32 which is disposed between the silicon oxide films 31 and 33 and includes first conductive minute particles, and a second nanocrystal layer 34 which is disposed between the silicon oxide films 33 and 35 and includes second conductive minute particles.

The first and second nanocrystal layers 32 and 34 include, for example, silicon nanocrystals (silicon minute particles), as the first and second conductive minute particles, respectively. As described above, the silicon oxide films 31, the nanocrystal layer 32, the silicon oxide film 33, the nanocrystal layer 34, and the silicon oxide film 35, which are stacked in this order, form a triple tunnel junction structure.

More specifically, a tunnel insulating film having a thickness of about 1 nm, for example, silicon oxide film 31 is formed on the n+ polysilicon interconnect 10 including phosphor impurities of high concentration.

The nanocrystal layer 32 which includes conductive minute particles, such as silicon nanocrystals (silicon minute particles), is formed on the silicon oxide film 31. A tunnel insulating film having a thickness of about 1 nm, for example, silicon oxide film 33 is formed on the nanocrystal layer 32. The nanocrystal layer 34 which includes conductive minute particles, such as silicon nanocrystals (silicon minute particles), is formed on the silicon oxide film 33. In addition, a tunnel insulating film having a thickness of about 1 nm, for example, silicon oxide film 35 is formed on the nanocrystal layer 34.

The diffused metal layer 41 is formed on the silicon oxide film 35. The resistance change layer 42 is formed on the diffused metal layer 41. In addition, the n+ polysilicon interconnect (or electrode) 20 which includes phosphor impurities of high concentration is formed on the resistance change layer 42.

In the memory device having the above structure, an average grain size of the conductive minute particles included in the nanocrystal layer 32 is different from an average grain size of the conductive minute particles included in the nanocrystal layer 34. For example, the average grain size of the conductive minute particles included in the nanocrystal layer 32 is larger than the average grain size of the conductive minute particles included in the nanocrystal layer 34.

[2] Method of Manufacturing the Memory Device

Next, a method of manufacturing the memory device according to the first embodiment will be explained hereinafter.

FIGS. 2A, 2B, 3A, and 3B are cross-sectional views illustrating the method of manufacturing the memory device according to the first embodiment.

As illustrated in FIG. 2A, a silicon oxide film 31 having a thickness of about 1 nm is formed by rapid thermal oxidation (RTO) on the n+ polysilicon interconnect 10 including phosphor impurities of high concentration. Next, an amorphous silicon (a-Si) film 32A is deposited with a thickness of about 2.5 nm on the silicon oxide film 31 by CVD or the like. Then, a silicon oxide film 33 having a thickness of about 1 nm is formed on the surface of the a-Si film 32A by thermal oxidation. Thereby, the thickness of the a-Si film 32A is reduced to about 2 nm, and a structure in which the a-Si film 32A is disposed between the silicon oxide films 31 and 33, each of which has a thickness of about 1 nm, from above and below is obtained.

Thereafter, the above structure is subjected to high-temperature annealing at 900° C. in a nitrogen atmosphere. Thereby, as illustrated in FIG. 2B, the a-Si film 32A is changed to a nanocrystal layer 32 which includes silicon minute crystals having a size of about 2 nm, which is equal to the thickness of the a-Si film 32A.

Next, as illustrated in FIG. 3A, an amorphous silicon film 34A is deposited with a thickness of about 1.5 nm on the silicon oxide film 33 by CVD or the like. Then, a silicon oxide film 35 having a thickness of about 1 nm is formed on the surface of the a-Si film 34A by thermal oxidation. Thereby, the thickness of the a-Si film 34A is reduced to about 1 nm, and a structure in which the a-Si film 34A is disposed between the silicon oxide films 33 and 35, each of which has a thickness of about 1 nm, from above and below is obtained.

Figure 3B:
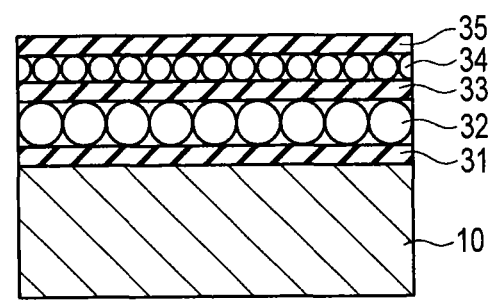

Thereafter, the above structure is subjected to high-temperature annealing at 950° C. in a nitrogen atmosphere. Thereby, as illustrated in FIG. 3B, the a-Si film 34A on the silicon oxide film 33 is changed to a nanocrystal layer 34 which includes silicon minute crystals having a size of about 1 nm, which is equal to the thickness of the a-Si film 34A.

Then, a conductive-bridge element serving as the variable resistance portion 40 is formed on the silicon oxide film 35. Specifically, a diffused metal layer 41 is formed on the tunnel insulating film 35 by sputtering or CVD, as illustrated in FIG. 1. Thereafter, a resistance change layer 42 is formed on the diffused metal layer 41.

A metal oxide, such as an amorphous silicon film, silicon rich oxide film, and aluminum oxide can be used as the resistance change layer 42, as described above. A layer which is capable of abundantly supplying diffused metal, such as nickel, silver, copper, and zinc, to the resistance change layer 42 can be used as the diffused metal layer 41. For example, a compound which includes the diffused metal and chalcogenide element can be used as the diffused metal layer 41.

Thereafter, as illustrated in FIG. 1, an n+ polysilicon interconnect 20 including phosphor impurities of high concentration is formed on the resistance change layer 42 by CVD or the like. By the above method, the memory device according to the first embodiment illustrated in FIG. 1 is manufactured.

In the above process, after the silicon nanocrystals (silicon minute particles) having a size equal to the thickness of the a-Si film are formed, horizontal crystal growth hardly occurs in a Si film of thin thickness (nanometers), since the silicon nanocrystals tend to maintain a crystal state in which the surface energy of the silicon nanocrystal is minimum. Thus, it is possible to control the grain size of the Si nanocrystals to a typical size equal to the film thickness, by adjusting the annealing conditions in the nitrogen atmosphere, when the nanocrystal layers 32 and 34 are formed. Although annealing for forming silicon nanocrystals is performed for each silicon nanocrystal layer in the present example, annealing may be performed for all the silicon nanocrystal layers together.

As described above, since the typical size of the Si nanocrystals depends on the thickness of the a-Si film, the typical size of the silicon nanocrystals of the lower nanocrystal layer 32 is 2 nm, and the typical size of the silicon nanocrystals of the upper nanocrystal layer 34 is 1 nm.

[3] Operation of the Memory Device

In the first embodiment, the silicon nanocrystals (silicon minute particles) have a small grain size of 2 nm or less, and thus satisfy the Coulomb blockade condition that energy for charging an electron is sufficiently larger than thermal fluctuation. Therefore, when an electron is charged in the silicon minute particle, a high energy state is formed in the silicon minute particle by the Coulomb blockade effect and the quantum confinement effect, and an energy barrier is formed when another electron passes through the silicon minute particle.

In the memory device, an energy barrier which is obtained by the Coulomb blockade effect and the quantum confinement effect in the silicon minute particle exists between tunnel barriers formed by the tunnel insulating films. The energy barrier increases as the grain size of the silicon minute particle decreases.

Thus, an energy barrier $\Delta E1$ of the lower silicon nanocrystal layer 32 is lower, and an energy barrier $\Delta E$ of the upper silicon nanocrystal layer 34 is higher than the energy barrier $\Delta E1$. The energy region obtained by the Coulomb blockade effect and the quantum confinement effect is an energy region which cannot be intruded, including tunnel effusion, and thus electrons have to exceed the energy barrier to pass through the energy region. Thus, excellent current control is achieved.

As described above, conductive minute particles which satisfy the Coulomb blockade condition and two tunnel junctions which sandwich the conductive minute particles are referred to as double tunnel junction. A series structure of conductive minute particles which satisfy the Coulomb blockade condition and at least two tunnel junctions which sandwich the conductive minute particles is referred to as multiple tunnel junction.

Figure 4C:
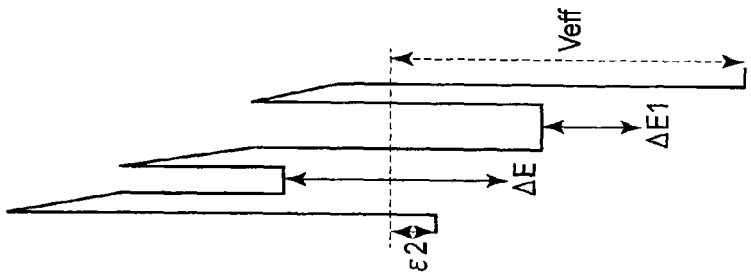
FIGS. 4A, 4B, and 4C are diagrams illustrating energy structures in a flat band state, and in the case where bias voltage is applied in the forward direction and the reverse direction in the multiple tunnel junction portion.
Figure 4B:
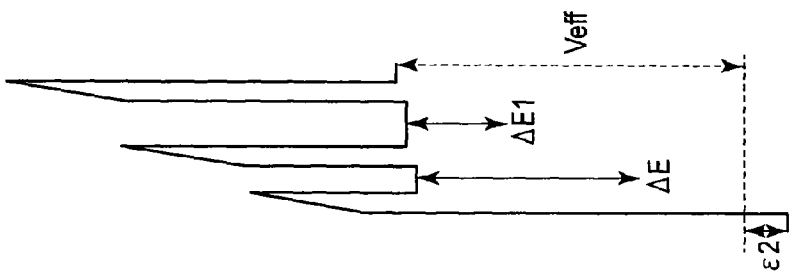
Figure 4A:
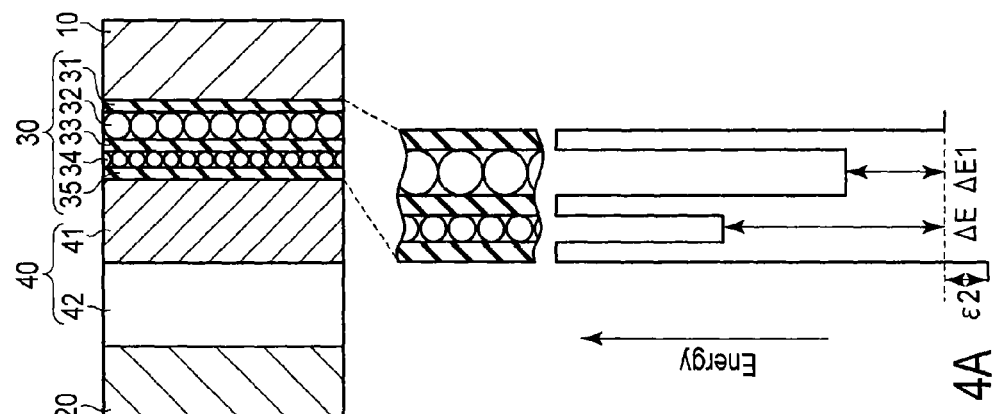

The rectifying function in the memory device of the first embodiment is achieved by the multiple tunnel junction portion 30. FIGS. 4A, 4B, and 4C illustrate energy structures in a flat band state, and when a bias voltage is applied in the forward direction and the reverse direction, in the multiple tunnel junction portion 30.

When a bias voltage is applied in the forward direction, that is, a potential difference which is larger than "Veff1=Max (3$\Delta E1$, 3$\Delta E$/2)" is applied to the multiple tunnel junction portion 30 in the forward direction, electrons are not blocked by the energy barrier and only pass through the thin silicon oxide films 31, 33 and 35 as illustrated in FIG. 4B, and thus electric current easily flows.

On the other hand, when the bias voltage is applied in the reverse direction, electrons are blocked by high energy barrier $\Delta E$, as illustrated in FIG. 4C. Thus, the current decreases in accordance with the exponential function "exp $[-(\Delta E+\epsilon 2-qVeff/3)/k_BT]$" (q denotes elementary charge, $k_B$ denotes Boltzmann constant, T denote temperature, typical value of which is 300K, and Veff denotes potential difference applied to the multiple tunnel junction portion 30). As is clear from FIG. 4A, $\epsilon 2$ denotes a difference between the electron affinity of silicon and the work function or electron affinity of the diffused metal layer 41. Specifically, as the energy barrier $\Delta E$ increases by 60 meV, the reverse current decreases by one digit.

As described above, while the ON voltage "Veff1=Max (3$\Delta E1$, 3$\Delta E$/2)" when the bias voltage is applied in the forward direction is proportional to the energy barriers $\Delta E1$, $\Delta E$, the current when the bias voltage is applied in the reverse direction effectively reduces in an exponential function manner with respect to the energy barrier $\Delta E$. Thus, very excellent rectification can be achieved by designing the energy barriers $\Delta E1$ and $\Delta E$ by using the grain sizes of the silicon nanocrystals.

Although all the silicon oxide films (tunnel insulating films) 31, 33, and 35 have the same thickness (about 1 nm) in the above explanation, when the thicknesses of them are not the same, they can be generalized in consideration of the fact that the potential difference is distributed in proportion to the thickness. Supposing that the thicknesses of the silicon oxide films 31, 33, and 35 are T1, T3, and T5, respectively, the ON voltage when the bias voltage is applied in the forward direction is "Veff1=Max [((T1+T2+T3)/T1) $\Delta E1$, (T1+T2+T3) $\Delta E$/(T1+T2)]", and the current decreasing rate when the bias voltage is applied in the reverse direction is "exp $[-(\Delta E+\epsilon 2-qVeff[T3/(T1+T2+T3)]/k_BT]$". Thus, very excellent rectification can still be achieved, by designing the energy barriers $\Delta E1$ and $\Delta E$ by using the grain sizes of the silicon nanocrystals.

The variable resistance portion 40 that includes the diffused metal layer 41 and the resistance change layer 42 is a reversible resistance change element, which is known as, for example, conductive-bridge element. When a proper write voltage is applied to the variable resistance portion 40, metal ions or metal elements are diffused into the resistance change layer 42 from the diffused metal layer 41, and thereby a current path is formed. Thereby, the variable resistance portion 40 can be changed from the high-resistance state to the low-resistance state.

On the other hand, when a proper erase voltage is applied to the variable resistance portion 40, metal ions or metal elements in the resistance change layer 42, which form the current path, move toward the diffused metal layer 41, and the current path disappears. Thereby, the variable resistance portion 40 returns to the high-resistance state from the low-resistance state. Since the metal ions or metal elements are moved in the reverse direction, the erase voltage generally has a direction reverse to that of the write voltage.

To read the resistance state of the variable resistance portion 40, a proper read voltage is applied to the variable resistance portion 40, and thereby the resistance state can be read out by detecting the difference in resistance. The read voltage can have the same direction as that of the write voltage, or the same direction as that of the erase voltage. The read voltage is generally smaller than the write voltage and the erase voltage, to prevent erroneous writing and erroneous erasing. The characteristic of maintaining the low-resistance state and the high-resistance state in the first embodiment depends on the structure of the film of the resistance change layer 42 and the type of the diffused metal supplied from the diffused metal layer 41. As described above, writing, erasing, and reading are performed by applying a proper operating voltage to the variable resistance portion 40 in the first embodiment.

The memory device according to the first embodiment has a structure in which the variable resistance portion 40 and the multiple tunnel junction portion 30 are connected in series. Thus, each operating voltage, that is, write, erase, and reading voltages, increases in the memory device, in comparison with each of the write voltage, erase voltage, and read voltage required only for the variable resistance portion.

First, an increase in the operating voltage when the bias voltage is applied to the multiple tunnel junction portion 30 in the forward direction will be explained. The ON voltage when the bias voltage is applied to the multiple tunnel junction portion 30 in the forward direction is "Veff1=Max [([T1+T2+T3]/T1) $\Delta$E1, (T1+T2+T3) $\Delta$E/(T1+T2)]". When the voltage is applied to the multiple tunnel junction portion 30, the multiple tunnel junction portion 30 is changed to the low-resistance state, and the rest of the voltage is applied to the variable resistance portion 40. Thus, supposing that the operating voltage (write voltage, erase voltage, or read voltage) required only for the variable resistance portion is Veff2, the operating voltage of the memory device in the first embodiment is "V=Veff2+Veff1". Specifically, the memory operating voltage in the forward direction of the multiple tunnel junction portion 30 can be controlled with the operating voltage required only for the variable resistance portion 40, the energy barriers $\Delta$E1 and $\Delta$E that depends on the grain sizes of the silicon minute particles included in the nanocrystal layers 32 and 34, and the thicknesses T1, T2, and T3 of the silicon oxide films (tunnel insulating films).

Next, an increase in the operating voltage when the bias voltage is applied to the multiple tunnel junction portion 30 in the reverse direction will be explained hereinafter. Since no current flows through the multiple tunnel junction portion 30 when the bias voltage is applied in the reverse direction, supposing that the effective oxidation thickness (EOT) of the multiple tunnel junction portion 30 is denoted by Teff1, the effective oxidation thickness of the variable resistance portion 40 is denoted by Teff2, and the operating voltage (write voltage or erase voltage) required only for the variable resistance portion is denoted by Veff2, the operating voltage of the memory device according to the first embodiment satisfies "V=Veff2×(Teff1+Teff2)/Teff2". Specifically, the memory operating voltage when the bias voltage is applied to the multiple tunnel junction portion 30 in the reverse direction can be controlled by the operating voltage required only for the variable resistance portion 40, and Teff1 and Teff2 that depend on the stacked structure of the multiple tunnel junction portion 30 and the variable resistance portion 40.

As described above, increase in voltage from the operating voltage required only for the variable resistance portion for each of the forward/reverse bias voltages applied to the multiple tunnel junction portion 30 can be controlled by the device structure design, such as the thicknesses of the multiple tunnel junction portion 30 and the grain sizes of the silicon nanocrystals (silicon minute particles). Whether to use the forward bias or the reverse bias with respect to the multiple tunnel junction portion 30 as the operating voltage can be controlled by designing the direction of the operating voltage of the variable resistance portion 40 and the rectification direction of the multiple tunnel junction portion 30. The bias direction of the read voltage is always equal to the forward direction of the multiple tunnel junction portion 30, since it is necessary to read out turning on/off of the current.

To normally operate the memory device of the first embodiment, it is desirable that the resistance in the high-resistance state (OFF state) of the variable resistance portion 40 is sufficiently larger than the resistance in the low-resistance state (ON state) in the forward direction of the multiple tunnel junction portion 30.

Figure 5A:
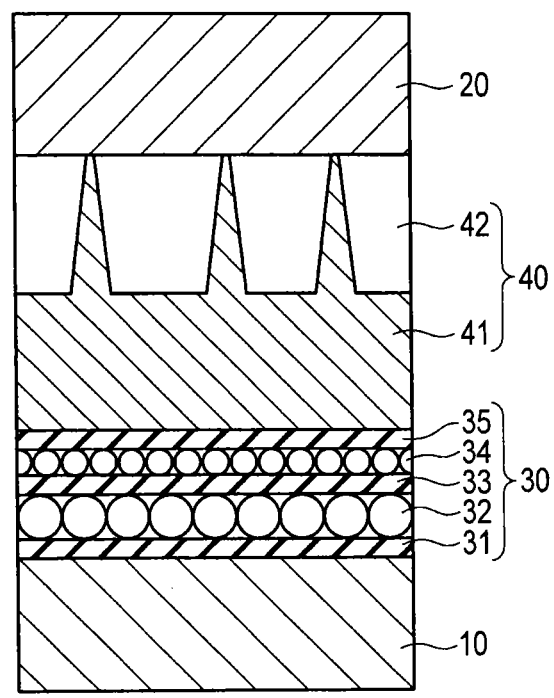
FIGS. 5A and 5B are schematic diagrams illustrating a low-resistance state and a high-resistance state in the memory device according to the first embodiment.
Figure 5B:
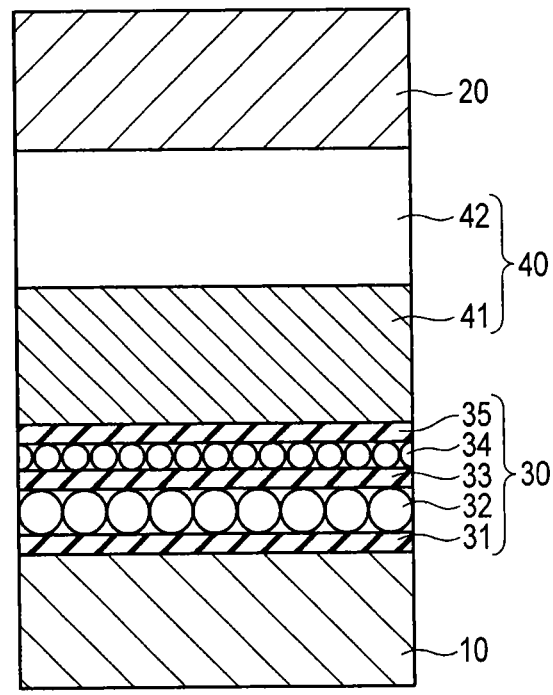

FIGS. 5A and 5B are schematic diagrams of the low-resistance state and the high-resistance state in the memory device according to the first embodiment.

The variable resistance portion 40 in the first embodiment includes a conductive-bridge element. When the variable resistance portion 40 is in the low-resistance state, the metal in the diffused metal layer 41 is diffused into the resistance change layer 42, and form the current path, as illustrated in FIG. 5A. When the variable resistance portion 40 is in the high-resistance state, the resistance change layer 42 includes no current paths formed of the metal diffused into the resistance change layer 42, as illustrated in FIG. 5B, and thus the variable resistance portion 40 has high resistance.

The low-resistance/high-resistance state is read out by applying a forward read voltage to the memory device. In the high-resistance state illustrated in FIG. 5B, when the resistance of the variable resistance portion 40 is not larger than the forward resistance of the multiple tunnel junction portion 30, the read resistance is almost equal to the forward resistance of the multiple tunnel junction portion 30. In this case, the resistance which is read out in the low-resistance state illustrated in FIG. 5A is equal to the forward resistance of the multiple tunnel junction portion 30, and it is difficult to distinguish the high-resistance state from the low-resistance state. Thus, it is desirable that the resistance in the high-resistance state (OFF state) of the variable resistance portion 40 is sufficiently larger than the resistance in the low-resistance state in the forward direction of the multiple tunnel junction portion 30.

The low resistance in the forward direction of the multiple tunnel junction portion 30 can be designed by using the thicknesses of the tunnel insulating films, since electrons are not blocked by the energy barriers as illustrated in FIG. 4B. The resistance of the high-resistance state (OFF state) of the variable resistance portion 40 can be controlled to a certain degree to be sufficiently larger than the resistance of the low-resistance state in the forward direction of the multiple tunnel junction portion 30, by adjusting the film thicknesses of the tunnel insulating films.

The resistance of the high-resistance state (OFF state) in the memory device depends on the high-resistance state of the variable resistance portion 40. The resistance in the low-resistance state (ON state) in the memory device depends on the higher value of the low resistance of the variable resistance portion 40 and the low resistance in the forward direction of the multiple tunnel junction portion 30.

Thus, it is possible to design the ON resistance of the memory device, not only design of the variable resistance portion 40 but also design of the thicknesses of the silicon oxide films (tunnel insulating films) of the multiple tunnel junction portion 30.

Next, a memory device according to a modification of the first embodiment will be explained hereinafter.

According to the current decreasing rate "exp $[-(\Delta E+\epsilon 2-qVeff/3)/k_BT]$" when the reverse bias is applied, the reverse current decreases by one digit as $\epsilon 2$ increases by 60 meV, like the energy barrier $\Delta$E. Thus, as a modification of the first embodiment, it is possible to use a structure in which a buffer metal layer 36 is disposed between the multiple tunnel junction portion 30 and the variable resistance portion 40, as illustrated in FIG. 6, such that $\epsilon 2$ can be designed.

The modification is manufactured by a process of forming the buffer metal layer 36 on the silicon oxide film (tunnel insulating film) 35 by CVD or sputtering, and forming the diffused metal layer 41 on the buffer metal layer 36.

In the modification illustrated in FIG. 6, $\epsilon 2$ illustrated in FIG. 4A denotes a difference between the electron affinity of silicon and the work function of the buffer metal layer 36. In the modification, the work function is adjusted according to the type of metal included in the buffer metal layer 36, and thereby $\epsilon 2$ can be designed to improve rectification. Since the reverse current is more suppressed and more excellent rectification is obtained as $\epsilon 2$ increases, it is desirable to use metal which has large work function for the buffer metal layer 36.

In the first embodiment illustrated in FIG. 1, it is necessary to design the diffused metal layer 41 to provide the conductive-bridge element with the variable resistance function, and thus design of the diffused metal layer 41 is restricted. In the modification illustrated in FIG. 6, however, $\epsilon 2$ can be designed by the buffer metal layer 36, and thus the degree of freedom for designing $\epsilon 2$ is markedly increased. Thus, in the modification of FIG. 6, design for improving rectification is easily performed by designing $\epsilon 2$ by using the buffer metal layer 36. Specifically, the modification of FIG. 6 improves rectification.

In addition, in the modification, the buffer metal layer 36 is metal and resistance thereof is almost negligible, and thus the change in the operating voltage when the forward/reverse bias voltage is applied is the same as that in the first embodiment. Besides, since the resistance of the buffer metal layer 36 is almost negligible, it is desirable that the resistance in the high-resistance state (OFF state) of the variable resistance portion 40 is sufficiently larger than the resistance in the low-resistance state in the forward direction of the multiple tunnel junction portion 30, like the first embodiment.

As described above, according to the first embodiment and the modification thereof, rectification is achieved by the asymmetric multiple tunnel junction portion 30, and the currents and the voltages in operation can be controlled by design of the multiple tunnel junction portion 30. Thus, the variable resistance portion 40 can basically only have to perform writing, erasing, storage retention, and reading. Thus, the first embodiment and the modification having the above structures can provide a two-terminal resistance change memory device which can achieve all of writing and erasing, which changes the resistance between the two terminals, storage retention in the ON state and the OFF state, the forward and reverse rectifying function for the bias voltage, and control of the voltages and the currents in each operating state.

[Second Embodiment]

Although n+ polysilicon is used as the material of the upper and lower interconnects 10 and 20 in the first embodiment, another conductive material (such as metal or semiconductor) may be used. In particular, using metal as the material of the upper and lower interconnects is desirable form the viewpoint of reducing the resistance. In the case of using metal, since the work function of metal is generally larger than the electron affinity of silicon, the energy position of electrons from the interconnect changes.

The second embodiment shows an example of using metal interconnects 11 and 21 (see FIG. 7A), instead of the polysilicon interconnects 10 and 20 illustrated in FIG. 1. Examples of the material of the metal interconnects 11 and 21 are tungsten (W), tungsten nitride (WN), tantalum nitride (TaN), tungsten silicide (WSi), cobalt silicide (CoSi), and nickel silicide (NiSi).

The memory device of the second embodiment can be manufactured in the same manner as the first embodiment, except for the following step. Although the silicon oxide film (tunnel insulating film) 31 is formed by subjecting the surface of the polysilicon interconnect 10 to thermal oxidation in the first embodiment, a silicon oxide film 31 is formed by CVD such as atomic layer deposition (ALD) in the second embodiment in which the material of the interconnects is not silicon.

In addition, in the first embodiment, heating in a nitrogen atmosphere is used for formation of the silicon nanocrystal layers 32 and 34. In the second embodiment, however, when the metal that is the material of the metal interconnect 11 has a low melting point and it is difficult to heat the whole system at high temperature, used is a method of controlling the grain sizes of the silicon nanocrystals by heating at low temperature for a long time, or a method of controlling the grain sizes of the silicon nanocrystals by local heating using laser annealing. Thereby, it is possible to suppress influence on the interconnects, even when the metal that forms the interconnects has a low melting point.

Figure 7:
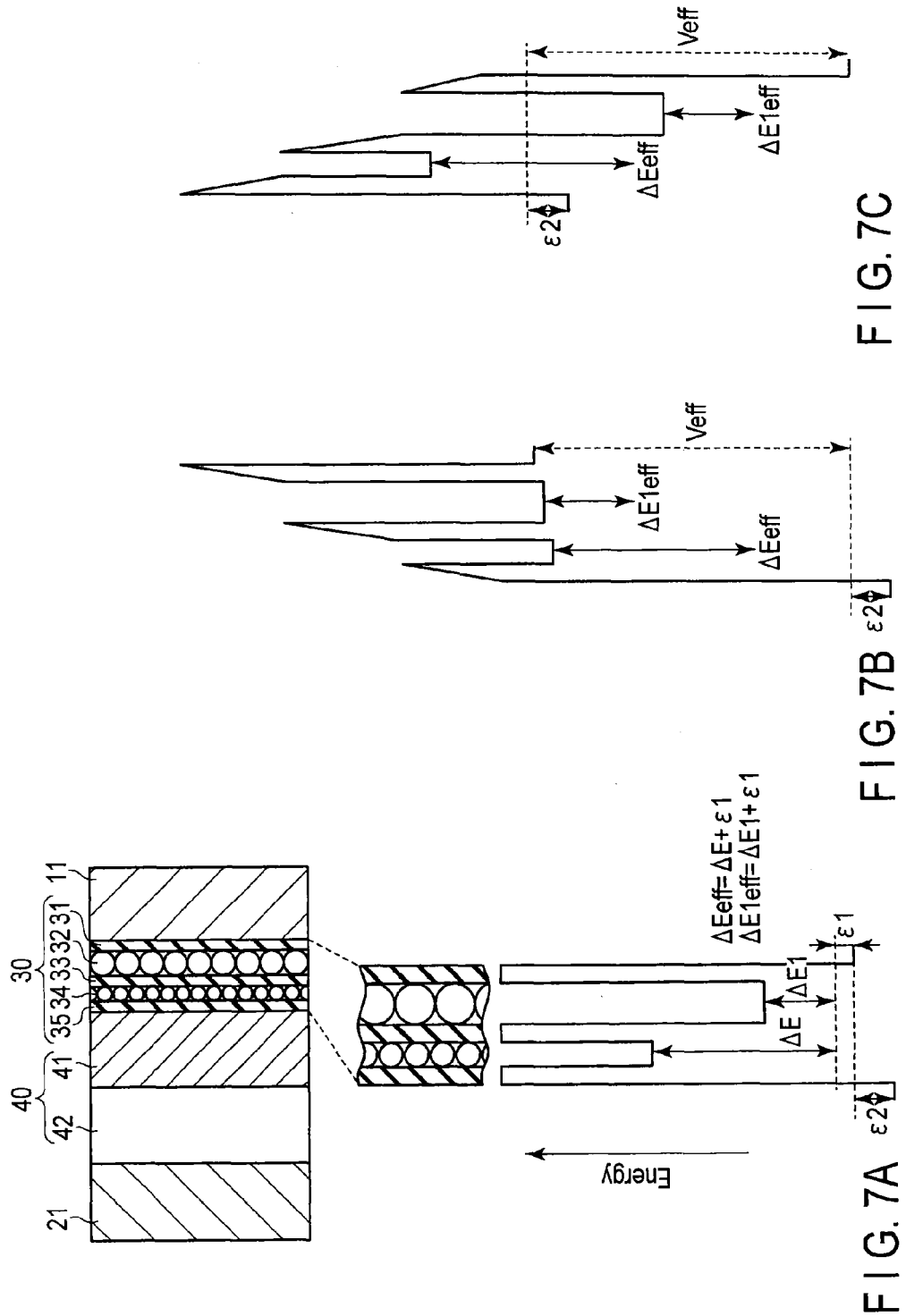
FIGS. 7A, 7B, and 7C are diagrams illustrating energy structures in a flat band state, and in the case where bias voltage is applied in the forward direction and the reverse direction in a multiple tunnel junction portion in a second embodiment.

FIGS. 7A, 7B, and 7C are diagrams illustrating energy structures in a flat band state and when the bias voltage is applied in the forward direction and the reverse direction in a multiple tunnel junction portion according to the second embodiment.

In the second embodiment, it is necessary to consider a difference $\Delta \epsilon$ between the electron affinity of silicon and the work function of the metal. Supposing that "$\Delta E\text{eff}=\Delta E+\epsilon 1$, $\Delta E1\text{eff}=\Delta E1+\epsilon 1$" in FIGS. 7A, 7B, and 7C, they are equal to the energy structures illustrated in FIGS. 4A, 4B, and 4C, when $\Delta E$ is replaced by $\Delta E\text{eff}$ and $\Delta E1$ is replaced by $\Delta E1\text{eff}$. Specifically, it is found that a rectification effect equal to that of the first embodiment is obtained by the same theory as the first embodiment, when the energy barriers obtained by the quantum confinement effect and the Coulomb blockade effect in the silicon nanocrystals are replaced by the effective energy barriers obtained in consideration of the difference between the electron affinity of silicon and the work function of the metal.

Thus, also in the second embodiment, it is possible to perform writing, erasing, storage retention, and reading by applying a proper voltage, as explained in the first embodiment with reference to FIGS. 4A to 4C, 5A, and 5B. The through current, the resistance, and the operating voltage in each state can be designed based on theory, based on the tunnel resistance of the silicon oxide films (tunnel insulating films), and the height of the effective energy barriers obtained in consideration of the difference between the electron affinity of silicon and the work function of the metal. The structure design for the thicknesses of the silicon oxide films and the grain sizes of the silicon nanocrystals (silicon minute particles) can contribute to the memory characteristics. In addition, adding the buffer metal layer 36 illustrated in the modification of FIG. 6 to the second embodiment also enables improvement of rectification by design of the work function of the buffer metal layer 36.

[Third Embodiment]

Although the diffused metal layer 41 and the resistance change layer 42 are deposited in this order on the multiple tunnel junction portion 30 in the memory device of the first embodiment, the diffused metal layer 41 and the resistance change layer 42 may be disposed in the reverse order. The third embodiment shows an example in which the diffused metal layer 41 and the resistance change layer 42 of the variable resistance portion are disposed in the reverse order.

FIG. 8 is a cross-sectional view illustrating a structure of a memory device according to the third embodiment.

As illustrated in FIG. 8, a variable resistance portion 50, in which a resistance change layer 42 and a diffused metal layer 41 are stacked in this order, is formed on a multiple tunnel junction portion 30. Specifically, the resistance change layer 42 is formed on a silicon oxide film 35, and the diffused metal layer 41 is formed on the resistance change layer 42. The other structures are the same as those of the first embodiment illustrated in FIG. 1.

The memory device of the third embodiment can be manufactured in the same as the first embodiment, except for the following step. The resistance change layer 42 is formed on the silicon oxide film 35 by sputtering or CVD, and the diffused metal layer 41 is formed on the resistance change layer 42 by sputtering or CVD.

Since the write voltage and the erase voltage are reversed between the third embodiment and the first embodiment, an increase in the operating voltage differs according to whether the voltage is a forward bias voltage or a reverse bias voltage. In addition, $\epsilon 2$ illustrated in FIGS. 4A, 4B, and 4C denotes a difference between the electron affinity of silicon and the electron affinity of the current path formed by the diffused metal in the resistance change layer 42.

The rectification function and contribution to control of the voltage and the current in each operating state obtained by the multiple tunnel junction portion 30 are the same as the first embodiment, and thus the third embodiment can also provide a structure which can easily control the characteristics of a two-terminal resistance change memory, like the first embodiment.

In addition, in the same manner as the modification (FIG. 6) of the first embodiment, when the buffer metal layer 36 with designed work function is formed between the silicon oxide film 35 and the resistance change layer 42 also in the third embodiment, the rectification is improved. The interconnects 10 and 20 may be formed of polysilicon as in the first embodiment, or metal as in the second embodiment, and the same effect is obtained in either case. When the interconnect 10 is formed of metal, the rectification characteristic may also be designed by the difference between the work function of the metal of the interconnect 10 and the electron affinity of silicon. The other structures and effects are the same as those of the first embodiment.

[Fourth Embodiment]

Although the forward direction of the multiple tunnel junction portion 30 in the memory device of the first embodiment is a direction of going from the interconnect 10 toward the variable resistance portion 40, the same effect as the first embodiment is obtained even when the forward direction is reversed. The fourth embodiment shows an example in which the multiple tunnel junction portion is vertically reversed.

FIG. 9 is a cross-sectional view illustrating a structure of a memory device according to the fourth embodiment.

As illustrated in FIG. 9, a silicon oxide film 35 having a thickness of about 1 nm is formed on a polysilicon interconnect 10. A nanocrystal layer 34 that includes conductive minute particles, such as silicon nanocrystals (silicon minute particles), is formed on the silicon oxide film 35. A silicon oxide film 33 having a thickness of about 1 nm is formed on the nanocrystal layer 34. A nanocrystal layer 32 that includes conductive minute particles, such as silicon nanocrystals (silicon minute particles), is formed on the silicon oxide film 33. A silicon oxide film 31 having a thickness of about 1 nm is formed on the nanocrystal layer 32. A variable resistance portion 40 is formed on the silicon oxide film 31.

In the memory device having the above structure, an average grain size of the conductive minute particles included in the nanocrystal layer 32 is larger than an average grain size of the conductive minute particles included in the nanocrystal layer 34.

The memory device of the fourth embodiment can be manufactured in the same manner as the first embodiment, except for the following step. Film formation and thermal treatment are performed, such that the silicon nanocrystal included in the lower nanocrystal layer 34 has a grain size (thickness) of 1 nm, and the silicon nanocrystal included in the upper nanocrystal layer 32 has a grain size (thickness) of 2 nm.

More specifically, the silicon oxide film 35 having a thickness of about 1 nm is formed on the polysilicon interconnect 10 by rapid thermal oxidation (RTO). Then, an amorphous silicon (a-Si) film with a thickness of about 1.5 nm is deposited on the silicon oxide film 35 by CVD. Thereafter, silicon oxide film 33 having a thickness of about 1 nm is formed on the surface of the a-Si film by thermal oxidation. Thereby, the thickness of the a-Si film is reduced to about 1 nm, and a structure of sandwiching the a-Si film between the silicon oxide films 35 and 33, each of which has a thickness of about 1 nm, from above and below is obtained.

Next, high-temperature annealing is performed at 900° C. in a nitrogen atmosphere. Thereby, as illustrated in FIG. 9, the a-Si film is changed to nanocrystal layer 34, which includes silicon nanocrystals having a size of about 1 nm, which is equal to the thickness of the a-Si film.

Then, an amorphous silicon (a-Si) film with a thickness of about 2.5 nm is deposited on the silicon oxide film 33 by CVD. Thereafter, silicon oxide film 31 having a thickness of about 1 nm is formed on the surface of the a-Si film by thermal oxidation. Thereby, the thickness of the a-Si film on the silicon oxide film 33 is reduced to about 2 nm, and a structure of sandwiching the a-Si film between the silicon oxide films 33 and 31, each of which has a thickness of about 1 nm, from above and below is obtained.

Next, high-temperature annealing is performed at 950° C. in a nitrogen atmosphere. Thereby, as illustrated in FIG. 9, the a-Si film on the silicon oxide film 33 is changed to nanocrystal layer 32, which includes silicon nanocrystals having a size of about 2 nm, which is equal to the thickness of the a-Si film.

Since the rectifying forward/reverse bias voltages of the multiple tunnel junction portion 60 in the fourth embodiment are reversed in comparison with the first embodiment, an increase in the operating voltage is different according to whether the bias voltage is a forward bias voltage or a reverse bias voltage, as explained in the first embodiment.

The rectification function and contribution to control of the voltage and the current in each operating state obtained by the multiple tunnel junction portion 60 are the same as the first embodiment, and thus the fourth embodiment can also provide a structure which can easily control the characteristics of a two-terminal resistance change memory, like the first embodiment.

In addition, it is possible to design the rectifying characteristic, in accordance with the difference between the electron affinity of silicon and the work function or the electron affinity of the diffused metal layer 41. Besides, in the same manner as the modification (FIG. 6) of the first embodiment, when the buffer metal layer 36 with designed work function is formed between the silicon oxide film 31 and the diffused metal layer 41 also in the fourth embodiment, the rectification is improved. The interconnects 10 and 20 may be formed of polysilicon as in the first embodiment, or metal as in the second embodiment, and the same effect is obtained in either case. When the interconnect 10 is formed of metal, the rectification characteristic may also be designed by the difference between the work function of the metal of the interconnect 10 and the electron affinity of silicon. The other structures and effects are the same as those of the first embodiment.

[Fifth Embodiment]

Although the multiple tunnel junction portion 30 is disposed only on the interconnect 10 in the memory device of the first embodiment, a multiple tunnel junction portion 30 may also be disposed on the interconnect 20. The fifth embodiment shows an example in which a multiple tunnel junction portion is provided both on and under the variable resistance portion 40.

FIG. 10 is a cross-sectional view illustrating a structure of a memory device according to the fifth embodiment.

As illustrated in FIG. 10, a multiple tunnel junction portion 70 is formed between a variable resistance portion 40 and a polysilicon interconnect 20.

More specifically, a silicon oxide film (tunnel insulating film) 71 having a thickness of about 1 nm is formed on a resistance change layer 42. A nanocrystal layer 72 that includes conductive minute particles, such as silicon nanocrystals (silicon minute particles), is formed on the silicon oxide film 71. A silicon oxide film (tunnel insulating film) 73 having a thickness of about 1 nm is formed on the nanocrystal layer 72. A nanocrystal layer 74 that includes conductive minute particles, such as silicon nanocrystals (silicon minute particles), is formed on the silicon oxide film 73. A silicon oxide film (tunnel insulating film) 75 having a thickness of about 1 nm is formed on the nanocrystal layer 74.

In the memory device having the above structure, an average grain size of the conductive minute particles included in the nanocrystal layer 72 is different from an average grain size of the conductive minute particles included in the nanocrystal layer 74. For example, the average grain size of the conductive minute particles included in the nanocrystal layer 72 is larger than the average grain size of the conductive minute particles included in the nanocrystal layer 74.

The memory device of the fifth embodiment can be manufactured in the same manner as the first embodiment, except for the following step. The asymmetric multiple tunnel junction portion 70 is formed on the resistance change layer 42, in the same manner as forming the asymmetric multiple tunnel junction portion 30 on the polysilicon interconnect 10.

More specifically, the silicon oxide film 71 having a thickness of about 1 nm is formed on the resistance change layer 42 by atomic layer deposition (ALD). Then, an amorphous silicon (a-Si) film with a thickness of about 2.5 nm is deposited on the silicon oxide film 71 by CVD. Thereafter, silicon oxide film 73 having a thickness of about 1 nm is formed on the surface of the a-Si film by thermal oxidation. Thereby, the thickness of the a-Si film is reduced to about 2 nm, and a structure of sandwiching the a-Si film between the silicon oxide films 71 and 73, each of which has a thickness of about 1 nm, from above and below is obtained.

Next, high-temperature annealing is performed at 900° C. in a nitrogen atmosphere. Thereby, as illustrated in FIG. 10, the a-Si film is changed to nanocrystal layer 72, which includes silicon nanocrystals having a size of about 2 nm, which is equal to the thickness of the a-Si film.

Then, an amorphous silicon (a-Si) film with a thickness of about 1.5 nm is deposited on the silicon oxide film 73 by CVD. Thereafter, silicon oxide film 75 having a thickness of about 1 nm is formed on the surface of the a-Si film on the silicon oxide film 73 by thermal oxidation. Thereby, the thickness of the a-Si film on the silicon oxide film 73 is reduced to about 1 nm, and a structure of sandwiching the a-Si film between the silicon oxide films 73 and 75, each of which has a thickness of about 1 nm, from above and below is obtained.

Next, high-temperature annealing is performed at 950° C. in a nitrogen atmosphere. Thereby, as illustrated in FIG. 10, the a-Si film on the silicon oxide film 73 is changed to nanocrystal layer 74, which includes silicon nanocrystals having a size of about 1 nm, which is equal to the thickness of the a-Si film.

Since the fifth embodiment includes two multiple tunnel junction portions 30 and 70 having a rectifying function, the fifth embodiment achieves more stable rectification than that of the first embodiment. The fifth embodiment has, however, a larger increase in the operating voltage than that of the first embodiment.

The rectification function and contribution to control of the voltage and the current in each operating state obtained by the multiple tunnel junction portion 30 and 70 are the same as the first embodiment, and thus the fifth embodiment can also provide a structure which can easily control the characteristics of a two-terminal resistance change memory, like the first embodiment.

It is possible to design the rectifying characteristic, in accordance with the difference between the electron affinity of silicon and the work function or electron affinity of the diffused metal layer 41, or the difference between the electron affinity of silicon and the work function of the current path formed by the diffused metal in the resistance change layer 42. Besides, the rectification is improved, when the buffer metal layer 36 with designed work function is formed between the silicon oxide film 35 and the diffused metal layer 41, or between the resistance change layer 42 and the silicon oxide film 71 also in the fifth embodiment, in the same manner as the modification (FIG. 6) of the first embodiment. The interconnects 10 and 20 may be formed of polysilicon as in the first embodiment, or metal as in the second embodiment, and the same effect is obtained in either case. When the interconnects 10 and 20 are formed of metal, the rectification characteristic may also be designed by the difference between the work function of the metal of the interconnects 10 and 20 and the electron affinity of silicon. The other structures and effects are the same as those of the first embodiment.

[Sixth Embodiment]

Although the memory device of the first embodiment has a triple tunnel junction structure in which a multiple tunnel junction portion includes two silicon nanocrystal layers, the multiple tunnel junction structure may includes three or more silicon nanocrystal layers. The sixth embodiment shows an example in which a multiple tunnel junction portion has quadruple tunnel junction structure which includes three silicon nanocrystal layers.

FIG. 11 is a cross-sectional view illustrating a structure of a memory device according to the sixth embodiment.

As illustrated in FIG. 11, a multiple tunnel junction portion 80 is formed between a polysilicon interconnect 10 and a variable resistance portion 40.

More specifically, a silicon oxide film (tunnel insulating film) 81 having a thickness of about 1 nm is formed on the polysilicon interconnect 10. A nanocrystal layer 82 that includes conductive minute particles, such as silicon nanocrystals (silicon minute particles), is formed on the silicon oxide film 81. A silicon oxide film 31 having a thickness of about 1 nm is formed on the nanocrystal layer 82. A nanocrystal layer 32, a silicon oxide film 33, a nanocrystal layer 34, and a silicon oxide film 35 are formed in this order on the silicon oxide film 31. The other structures are the same as those of the first embodiment illustrated in FIG. 1.

In the memory device having the above structure, average grain sizes of the conductive minute particles included in the nanocrystal layers 82, 32, and 34 are different from each other. For example, the average grain size of the conductive minute particles included in the nanocrystal layer 82 is larger than the average grain size of the conductive minute particles included in the nanocrystal layer 32. In addition, the average grain size of the conductive minute particles included in the nanocrystal layer 32 is larger than the average grain size of the conductive minute particles included in the nanocrystal layer 34.

The memory device of the sixth embodiment can be manufactured in the same manner as the first embodiment, except for the following step. Film formation and thermal treatment are performed, such that the silicon nanocrystals included in the lower nanocrystal layer 82 have a grain size (thickness) of 3 nm, the silicon nanocrystals included in the nanocrystal layer 32 above the nanocrystal layer 82 have a grain size (thickness) of 2 nm, and the silicon nanocrystals included in the upper nanocrystal layer 34 has a grain size (thickness) of 1 nm.

More specifically, the silicon oxide film 81 having a thickness of about 1 nm is formed on the polysilicon interconnect 10 by rapid thermal oxidation (RTO). Then, an amorphous silicon (a-Si) film with a thickness of about 3.5 nm is deposited on the silicon oxide film 81 by CVD. Thereafter, silicon oxide film 31 having a thickness of about 1 nm is formed on the surface of the a-Si film by thermal oxidation. Thereby, the thickness of the a-Si film is reduced to about 3 nm, and a structure of sandwiching the a-Si film between the silicon oxide films 81 and 31, each of which has a thickness of about 1 nm, from above and below is obtained.

Next, high-temperature annealing is performed at 900° C. in a nitrogen atmosphere. Thereby, as illustrated in FIG. 11, the a-Si film is changed to nanocrystal layer 82, which includes silicon nanocrystals having a size of about 3 nm, which is equal to the thickness of the a-Si film.

Also in the sixth embodiment, an increase in the operating voltage is different based on whether the bias voltage is forward bias voltage or reverse bias voltage as explained in the first embodiment, like the first embodiment. In the sixth embodiment, although each voltage may slightly increase since the sixth embodiment has quadruple tunneling junction and the number of the tunnel insulating films increases, the sixth embodiment achieves more stable rectification.

Figure 12:
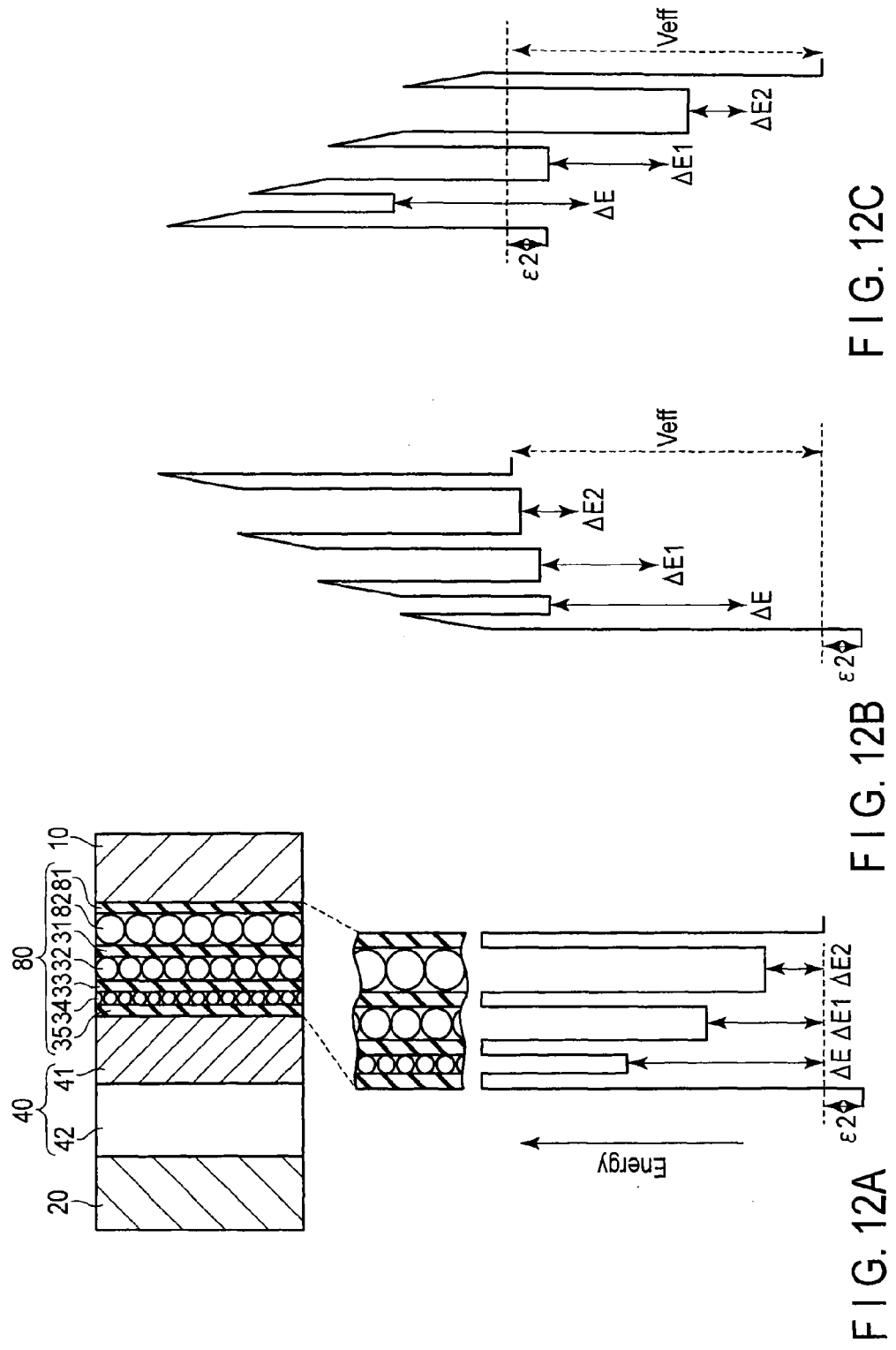
FIGS. 12A, 12B, and 12C are diagrams illustrating energy structures in a flat band state, and in the case where bias voltage is applied in the forward direction and the reverse direction in a multiple tunnel junction portion in the sixth embodiment.

FIGS. 12A, 12B, and 12C are diagrams illustrating energy structures in a flat band state and a bias voltage is applied in the forward direction and the reverse direction in the multiple tunnel junction portion 80 in the sixth embodiment.

As is clear from FIG. 12B, since there are two low energy barriers ΔE1 and ΔE2 serving as buffers, the forward low-resistance state can be obtained with lower electric field for the same energy barrier ΔE. Thus, it is possible to suppress deterioration and breakage of the memory device, and improved reliability is achieved.

As described above, the multiple tunnel junction portion 80 having three or more silicon nanocrystal layers can also exhibit the effect. To achieve rectification, however, it is desirable that the energy barrier monotonically changes from the highest one to a lower one, or from the lowest one to a higher one, in the stacking order of the silicon nanocrystal layers. Thus, it is desirable that the grain sizes of the silicon nanocrystal layers monotonically change from the smallest one to the largest one, or from the largest one to the smallest one.

Since the multiple tunnel junction portion 80 enables the rectification function and contribution to control of the voltage and the current in each operating state, the sixth embodiment can also provide a structure which easily controls the characteristic of a two-terminal resistance change memory, like the first embodiment.

It is possible to design the rectifying characteristic, in accordance with the difference between the electron affinity of silicon and the work function or electron affinity of the diffused metal layer 41. Besides, the rectification is improved, when the buffer metal layer 36 with designed work function is formed between the silicon oxide film 35 and the diffused metal layer 41 also in the sixth embodiment, in the same manner as the modification (FIG. 6) of the first embodiment. The interconnects 10 and 20 may be formed of polysilicon as in the first embodiment, or metal as in the second embodiment, and the same effect is obtained in either case. When the interconnect 10 is formed of metal, the rectification characteristic may also be designed by the difference between the work function of the metal of the interconnect 10 and the electron affinity of silicon. The other structures and effects are the same as those of the first embodiment.

[Seventh Embodiment]

Although the memory device of the first embodiment has a triple tunnel junction structure in which a multiple tunnel junction portion includes two silicon nanocrystal layers, the multiple tunnel junction structure may be an asymmetric double tunnel junction structure which includes one silicon nanocrystal layer. The seventh embodiment shows an example in which a multiple tunnel junction portion has an asymmetric double tunnel junction structure which includes one silicon nanocrystal layer.

Figure 13:
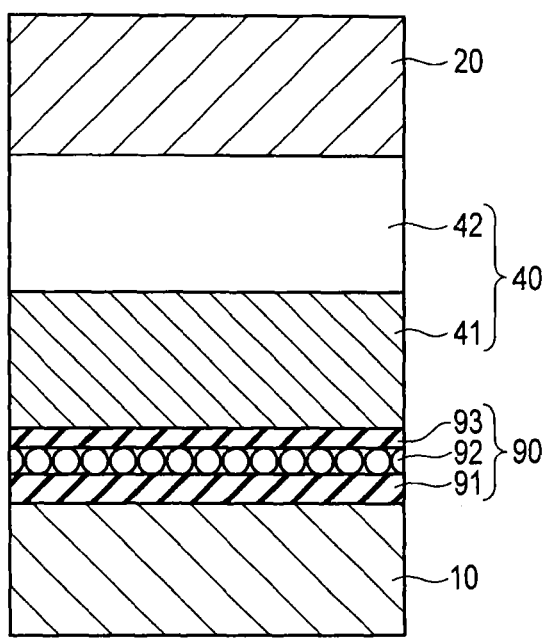
FIG. 13 is a cross-sectional view illustrating a structure of a memory device according to a seventh embodiment.

FIG. 13 is a cross-sectional view illustrating a structure of a memory device according to the seventh embodiment.

As illustrated in FIG. 13, an asymmetric double tunnel junction portion 90 is formed between a polysilicon interconnect 10 and a variable resistance portion 40.

More specifically, a silicon oxide film (tunnel insulating film) 91 is formed on the polysilicon interconnect 10. A nanocrystal layer 92 that includes conductive minute particles, such as silicon nanocrystals (silicon minute particles), is formed on the silicon oxide film 91. A silicon oxide film (tunneling insulating film) 93 is formed on the nanocrystal layer 92. The silicon oxide film 91 has a thickness larger than a thickness of the silicon oxide film 93. The other structures are the same as those of the first embodiment illustrated in FIG. 1.

The seventh embodiment having the above structure can also achieve rectification by the double tunnel junction portion 90, like the first embodiment.

Figure 14:
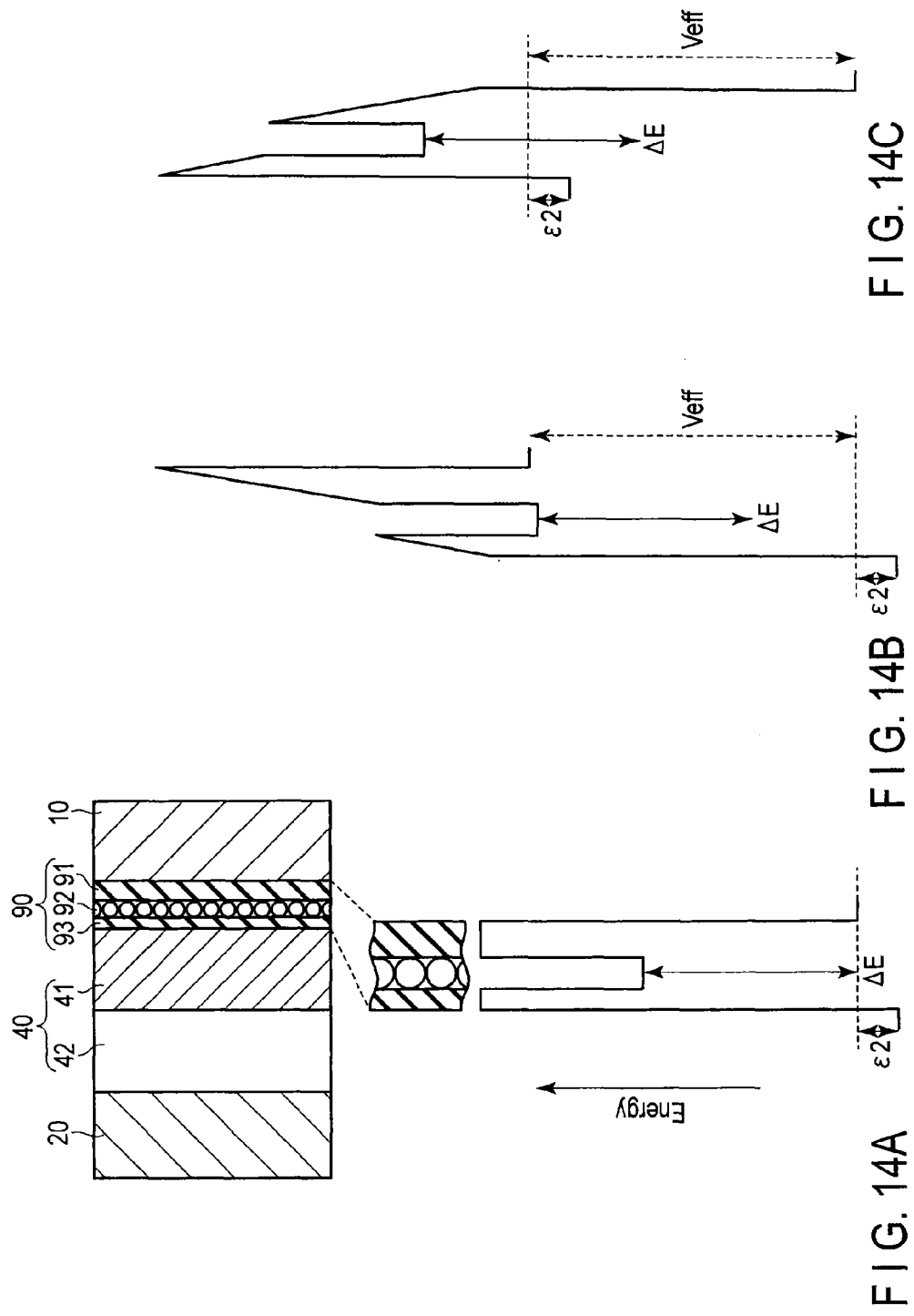
FIGS. 14A, 14B, and 14C are diagrams illustrating energy structures in a flat band state, and in the case where bias voltage is applied in the forward direction and the reverse direction in a multiple tunnel junction portion in the seventh embodiment.

FIGS. 14A, 14B, and 14C are diagrams illustrating energy structures in a flat band state and when a bias voltage is applied in the forward direction and the reverse direction in the double tunnel junction portion 90 in the seventh embodiment.

As illustrated in FIG. 14B, a proper voltage is applied in the forward direction, electrons are not blocked by an energy barrier ΔE of the nanocrystal layer 92, and thus electric current easily flows.

On the other hand, as illustrated in FIG. 14C, when a voltage is applied in the reverse direction, electrons are blocked by the high energy barrier ΔE, and electric current hardly flows. The ON voltage with which electric current easily flows in the forward direction is about "Veff1=ΔE×(T1+T2)/T1". T1 and T2 denote thicknesses of the silicon oxide films (tunnel insulating films) 91 and 93, respectively. The current decreasing rate in the reverse direction is about "exp[−(ΔE+ϵ2−qVeff[T2/(T1+T2)]/$k_B$T]×(R1/R2)". It is a requirement for generating rectification that the value of the current decreasing rate in the reverse direction is smaller than 1. R1 and R2 denote tunnel resistances of the silicon oxide films 91 and 93, respectively. Since the silicon oxide film 91 has a larger thickness, the expression "(R1/R2)" may have a large value in some cases, the reverse current decreases by one digit as the value of "ΔE+ϵ2" increases by 60 meV. Thus, the reverse current can be efficiently suppressed, by designing the energy barrier ΔE by adjusting the grain size of the silicon nanocrystals included in the nanocrystal layer 92, and designing ϵ2 by adjusting the work function of the diffused metal layer 41.

Also in the seventh embodiment, the rectification is improved, when the buffer metal layer 36 with designed work function is formed between the silicon oxide film 93 and the diffused metal layer 41, in the same manner as the modification (FIG. 6) of the first embodiment. The interconnects 10 and 20 may be formed of polysilicon as in the first embodiment, or metal as in the second embodiment, and the same effect is obtained in either case. When the interconnect 10 is formed of metal, the rectification characteristic may also be designed by using the difference between the work function of the metal of the interconnect 10 and the electron affinity of silicon. The other structures and effects are the same as those of the first embodiment.

[Eighth Embodiment]

Although the memory device according to the first embodiment uses a conductive-bridge element formed of the diffused metal layer 41 and resistance change layer 42, in which diffused metal is diffused, as a reversible variable resistance portion, another resistance change device may be used, as long as it is a reversible variable resistance portion which can perform writing, erasing, storage retention, and reading. The eighth embodiment shows an example of using a structure that is known as a variable resistive element, as reversible variable resistance portion.

Figure 15:
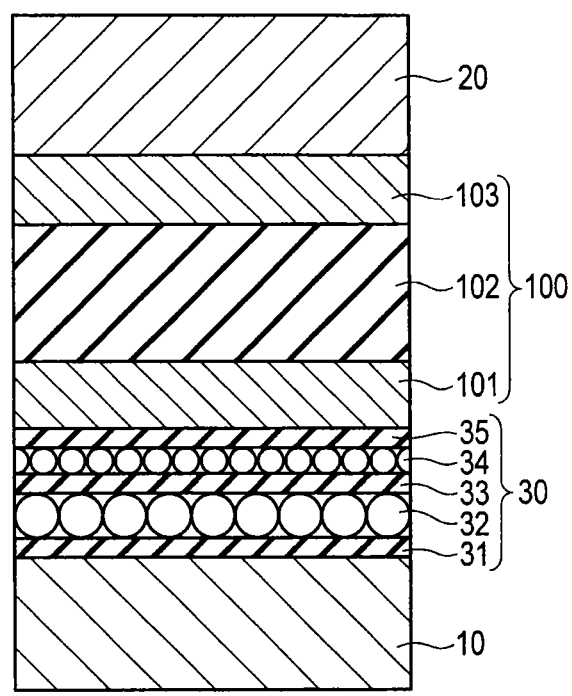
FIG. 15 is a cross-sectional view illustrating a structure of a memory device according to an eighth embodiment.

FIG. 15 is a cross-sectional view illustrating a structure of a memory device according to the eighth embodiment.

As illustrated in FIG. 15, a variable resistance portion 100, which is formed of a stacked structure including a first metal layer 101, a metal oxide layer 102, and a second metal layer 103, is formed between a multiple tunnel junction portion 30 and an interconnect 20.

More specifically, the first metal layer 101 is formed on the silicon oxide film 35, and the metal oxide layer 102 is formed on the first metal layer 101. The second metal layer 103 is formed on the metal oxide layer 102. The interconnect 20 is formed on the second metal layer 103. The other structures are the same as those of the first embodiment illustrated in FIG. 1.

Also in the variable resistance portion 100, a filament serving as a current path is formed in the metal oxide layer 102 by application of a proper voltage, and a reversible low-resistance state (ON state) can be formed. Examples of the material of the first and second metal layers 101 and 103 are platinum, tantalum, aluminum, and chromium. Examples of the material of the metal oxide layer 102 are an oxide, such as cobalt oxide and a nickel oxide.

The eighth embodiment achieves the same effect as that of the first embodiment. As illustrated in FIG. 4A to FIG. 4C, rectification can be achieved by the multiple tunnel junction portion 30. In addition, design for improving the rectification can be easily performed, by forming a buffer metal layer 36 with designed work function between the silicon oxide film 35 and the first metal layer 101 also in the eighth embodiment, like the modification (FIG. 6) of the first embodiment.

In addition, like the first embodiment, each operating voltage for writing, erasing, and reading increases also in the eighth embodiment, in comparison with the case of using only the variable resistance portion. Besides, like the first embodiment, rectification is achieved by the multiple tunnel junction portion 30, and the current and the voltage in each operation can be controlled also in the eighth embodiment. It is also desirable that the resistance in the high-resistance state (OFF state) of the variable resistance portion 100 is sufficiently larger than the resistance in the low-resistance state (ON state) in the forward direction of the multiple tunnel junction portion 30.

In addition, also in the eighth embodiment, the interconnects 10 and 20 may be formed of polysilicon as in the first embodiment, or metal as in the second embodiment, and the same effect is obtained in either case. When the interconnect 10 is formed of metal, the rectification characteristic may also be designed by using the difference between the work function of the metal of the interconnect 10 and the electron affinity of silicon.

Besides, the same effect is obtained, even when the structure of the variable resistance portion 100 is vertically reversed as in the third embodiment. The same effect is obtained, even when the structure of the multiple tunnel junction portion 30 is vertically reversed as in the fourth embodiment. The same effect is obtained, even when the multiple tunnel junction portion 30 is disposed adjacent to either of the upper and lower interconnects as in the fifth embodiment. The same effect is obtained, even when the multiple tunnel junction portion has a multiple tunnel junction structure including three or more silicon nanocrystal layers as in the sixth embodiment. The same effect is obtained, even when the multiple tunnel junction portion has an asymmetric double tunnel junction structure including one silicon nanocrystal layer as in the seventh embodiment.

[Ninth Embodiment]

Next, a cross-point memory which includes the memory device according to the first to eighth embodiments as a memory cell will be explained hereinafter.

FIG. 17 is a circuit diagram illustrating a structure of a cross-point memory according to the ninth embodiment.

As illustrated in FIG. 17, word lines WL0, WL1, and WL2 extend in an X-direction, and arranged at regular intervals in a Y-direction. Bit lines BL0, BL1, and BL2 extend in the Y-direction, and arranged at regular intervals in the X-direction. Memory cells MC (0-0), MC (0-1), . . . , MC (2-2) are arranged in respective crossing points between word lines WL0, WL1, and WL2 and bit lines BL0, BL1, and BL2 in a matrix manner. The memory devices according to the above first to eighth embodiments are used as the memory cells.

The cross-point memory according to the present embodiment has a structure in which memory devices (memory cells) are arranged in crossing points between the word lines and the bit lines. Since the memory devices of the first to eighth embodiments have the rectifying function, this structure can also prevent sneak current which is generated in reading.

[Tenth Embodiment]

In the first to sixth and eighth embodiments, the multiple tunnel junction portion (for example, portion 30 in FIG. 1) is formed by stacking a plurality of conductive minute particle layers having different average grain sizes, used to the process of forming conductive minute particle layers (nanocrystal layers) formed of conductive minute particles having almost the same grain size one by one. A tenth embodiment shows an example of forming a multiple tunnel junction portion at all once.

FIGS. 18A and 18B are cross-sectional views illustrating a method of manufacturing a memory device according to the tenth embodiment, and FIG. 18C is a cross-sectional view illustrating a structure of the memory device.

As illustrated in FIG. 18C, a multiple tunnel junction portion 180 is different from the multiple tunnel junction portion (portion 30 of FIG. 1) of the first embodiment. Conductive minute particles (for example, silicon nanocrystals) 182 are located at random in a tunnel insulating film, for example, a silicon oxide film 183. The conductive minute particles 182 are arranged, such that the average grain size of the conductive minute particles 182 monotonically increases from the upper part toward the lower part of the silicon oxide film 183

(from the side adjacent to the variable resistance portion 40 toward the side adjacent to the interconnect 10). The other structures are the same as those of the first embodiment.

The method of manufacturing the memory device according to the tenth embodiment is as follows. As illustrated in FIG. 18A, a tunnel insulating film, such as a silicon oxide film 181 with a thickness of about 1 nm is formed on the interconnect 10, and an amorphous silicon (a-Si) layer 189 with a thickness of about 6 nm is formed on the silicon oxide film 181, by CVD or oxidation.

Thereafter, the a-Si layer 189 is subjected to thermal oxidation. During the thermal oxidation, a-Si is locally changed to crystal silicon and simultaneously changed to silicon oxide by heat. When the changes are simultaneously performed, silicon nanocrystals of smaller grain size, which are formed in the a-Si layer, are harder to oxidize by surface stress. Although local crystallization in the a-Si layer 189 by heating uniformly advances in the film, oxidation by oxygen diffusion advances from the upper part of the film. Thus, in the upper part of the a-Si layer 189, amorphous parts around the crystals are oxidized at the early stage of crystallization, in which the crystals have small grain size. Therefore, silicon nanocrystals which are formed in the a-Si layer 189 by local crystallization have a smaller average grain size in the upper part of the film, in which oxidation advances earlier, and have a larger average grain size in the lower part of the film.

Therefore, by performing proper oxidation, the conductive minute particles (silicon nanocrystals) 182 are located at random in the silicon oxide film 183, and the average grain size thereof monotonically increases from the side adjacent to the variable resistance portion 40 to the side adjacent to the interconnect 10 in the silicon oxide film 183, as illustrated in FIG. 18B. The difference in average grain size between the upper part and the lower part, distribution, and nanocrystal density of the conductive minute particles (silicon nanocrystal) 182 in the multiple tunnel junction portion 180 can be controlled by changing the oxidation conditions.

The tenth embodiment is also expected to achieve the same effect as that of the first and sixth embodiments. When electrons pass through the multiple tunnel junction portion 180, multiple tunnel junction, in which silicon nanocrystals having the smallest grain size and silicon nanocrystals having the largest grain size are arranged from the variable resistance portion 40 to the interconnect 10, is formed. Thus, for example, in the same manner as FIG. 1 of the first embodiment and FIG. 11 of the sixth embodiment, a direction going from the interconnect 10 toward the diffused metal layer 41 is a forward direction in which electric current easily flows, and a direction going from the diffused metal layer 41 to the interconnect 10 is a reverse direction in which electric current hardly flows. Therefore, the multiple tunnel junction portion 180 can achieve excellent rectification, in the same manner as the first and sixth embodiments.

In the above manufacturing method, the silicon oxide film 181 is formed on the interconnect 10. However, when the a-Si layer 189 is subjected to thermal oxidation, the amorphous parts around the silicon nanocrystals which are locally formed are oxidized earlier. Thus, formation of the silicon oxide film 181 may be omitted. The a-Si layer 189 may be directly formed on the interconnect 10 and subjected to thermal oxidation, and silicon oxide which is generated by oxidation of the amorphous parts may be used as the lowest tunnel silicon oxide film.

Even when the multiple tunnel junction portion does not have a structure in which conductive minute particle layers having different average grain sizes are stacked in parallel, it suffices that the average grain size of the conductive minute particles monotonically changes from the larger one to the smaller one, as in the tenth embodiment. Thereby, when electrons pass through the multiple tunnel junction portion 180, multiple tunnel junction, in which silicon nanocrystals having the smallest grain size and silicon nanocrystals having the largest grain size are arranged from the variable resistance portion 40 to the interconnect 10, is formed. Thus, for example, like FIG. 1 of the first embodiment and FIG. 11 of the sixth embodiment, a direction going from the interconnect 10 to the diffused metal layer 41 is a forward direction in which electric current easily flows, and a direction going from the diffused metal layer 41 to the interconnect 10 is a reverse direction in which electric current barely flows. So, the effect of the present embodiment is expected. As in the first and second embodiments, Since the tenth embodiment does not adopt a process of forming layers formed of conductive minute particles (Si nanocrystals) of the same respective grain sizes, one by one, and stacking the layers, the Si nanocrystal grain size of the multiple tunnel junction portion, through which electrons pass, and the effective oxide film thickness between the Si nanocrystals may vary more widely from position to position.

However, since the grain size of Si nanocrystals having the smallest grain size can be controlled by suppressing surface oxidation by virtue of surface stress, it is possible to control formation of minimum Si nanocrystals having a smaller size than that of the first and sixth embodiments which control the grain size of the minimum Si nanocrystal by adjusting the thicknesses of the thin films. Thus, the tenth embodiment is expected to have more advantage since it can achieve excellent rectification using higher energy barriers in a smaller grain size.

Although the conductive minute particles (Si nanocrystals) of the smallest grain size to the largest grain size are formed by oxidation of the amorphous silicon layer in the tenth embodiment, the tenth embodiment is expected to be more suitable for controlling the smallest grain size, since the minute grain size of the Si nanocrystals can be controlled by suppressing progress of oxidation by virtue of surface stress as described above.

[Eleventh Embodiment]

The eleventh embodiment has a structure in which conductive minute particles (Si nanocrystals) of the smallest grain size are formed by oxidation of the amorphous silicon layer, and conductive minute particles of the largest grain size are formed by controlling the grain size by adjusting the thickness of the Si film in the same manner as the first to sixth and eighth embodiments.

Figure 19A:
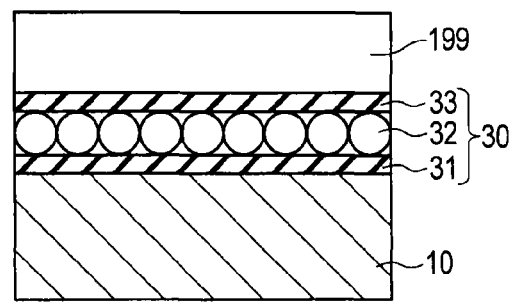
FIGS. 19A and 19B are cross-sectional views illustrating a method of manufacturing a memory device according to an eleventh embodiment.
Figure 19B:
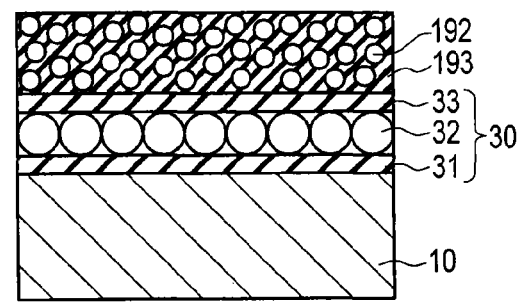
Figure 19C:
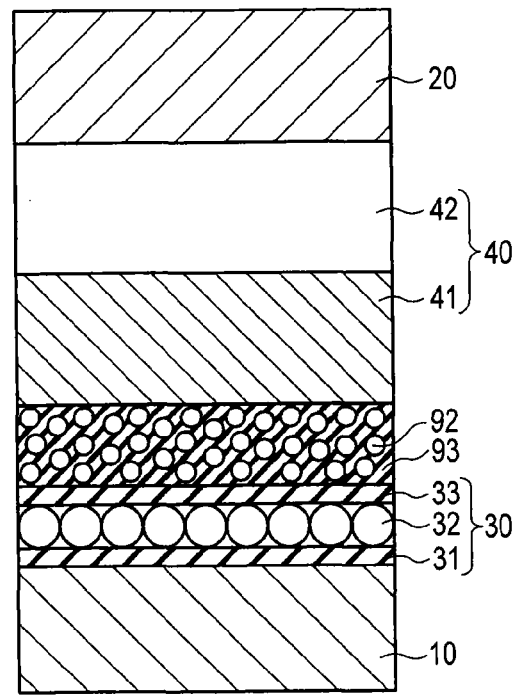
FIG. 19C is a cross-sectional view illustrating a structure of the memory device according to the eleventh embodiment.

FIGS. 19A and 19B are cross-sectional views illustrating a method of manufacturing a memory device according to the eleventh embodiment, and FIG. 19C is a cross-sectional view illustrating a structure of the memory device.

In the same manner as the first embodiment, the structure illustrated in FIG. 2B is formed, as illustrated in FIG. 19A. Thereafter, an amorphous silicon (a-Si) layer 199 with a thickness of about 4 nm is formed on the silicon oxide film 33. Then, the a-Si layer 199 is subjected to thermal oxidation. During the thermal oxidation, a-Si is locally changed to crystal silicon and simultaneously changed to silicon oxide by heat. When the changes are simultaneously performed, the conductive minute particles (Si nanocrystals) of smaller grain size, which are formed in the a-Si layer, are harder to oxidize by surface stress.

Thus, by subjecting the a-Si layer 199 to proper oxidation, conductive minute particles 192 are located at random in a silicon oxide film (tunnel insulating film) 193, as illustrated in FIG. 19B. Since the average grain size of the conductive minute particles 192 can be controlled by suppressing progress of oxidation by virtue of surface stress, a very small average grain size is obtained.

Then, as illustrated in FIG. 19C, a variable resistance portion 40 is formed on the silicon oxide film 193, and an interconnect 20 is formed on the variable resistance portion 40. Thereby, the memory device of the eleventh embodiment is formed. The other structures are the same as those of the first embodiment.

The smallest average grain size of the conductive minute particles (Si nanocrystals) in the multiple tunnel junction portion 30 can be controlled by changing the oxidation conditions. Since high energy barriers are formed by the Si nanocrystals having a very small minimum average grain size, the reverse bias current suppression effect of the multiple tunnel junction portion is improved, and excellent rectification is expected.

[Twelfth Embodiment]

Figure 16C:
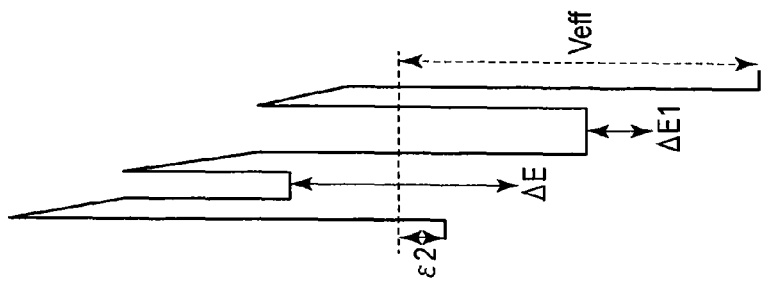
FIGS. 16A, 16B, and 16C are diagrams illustrating energy structures in a flat band state, and in the case where bias voltage is applied in the forward direction and the reverse direction in a multiple tunnel junction portion in the eighth embodiment.
Figure 16B:
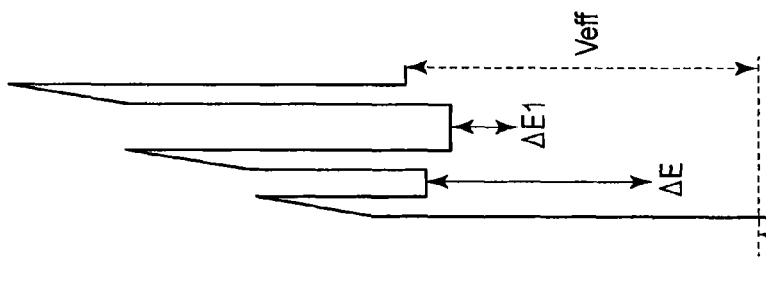
Figure 16A:
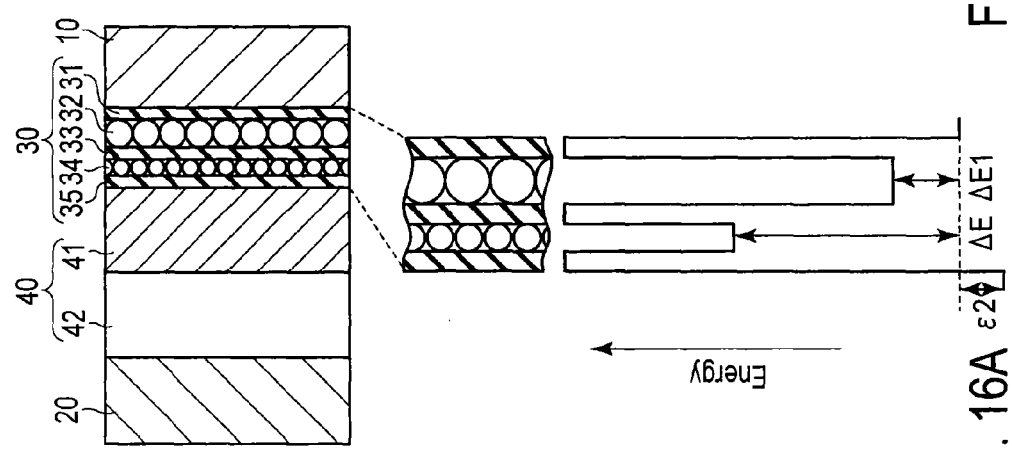

When the minimum grain size is obtained by suppressing progress of oxidation by virtue of surface stress and the maximum grain size is obtained by adjusting the thickness of the Si film in formation of the Si nanocrystals as in the eleventh embodiment, there are cases where electrons are accumulated in the Si nanocrystals of large grain size in application of the forward voltage, and the forward current does not smoothly flow, as illustrated in FIG. 16B, when the difference in the grain size is too large. The twelfth embodiment shows an example of forming conductive minute particles (Si nanocrystals) having a medium grain size and serving as buffer, by grain size control by adjusting the thickness of the Si film, and thereby reducing the difference in grain size between the adjacent Si nanocrystals.

FIGS. 20A and 20B are cross-sectional views illustrating a method of manufacturing a memory device according to the twelfth embodiment. FIG. 20C is a cross-sectional view illustrating a structure of the memory device.

In the same manner as the first embodiment, the structure illustrated in FIG. 3B is formed, as illustrated in FIG. 20A. Thereafter, an amorphous silicon (a-Si) layer 209 with a thickness of about 4 nm is formed on the silicon oxide film 35. Then, the a-Si layer 209 is subjected to thermal oxidation. During the thermal oxidation, a-Si is locally changed to crystal silicon and simultaneously changed to silicon oxide by heat. When the changes are simultaneously performed, the Si nanocrystals of smaller grain size, which are formed in the a-Si layer, are harder to oxidize by surface stress.

Thus, by subjecting the a-Si layer 209 to proper oxidation, conductive minute particles (silicon nanocrystals) 202 are located at random in a silicon oxide film (tunnel insulating film) 203, as illustrated in FIG. 20B. Since the average grain size of the conductive minute particles 202 can be controlled by suppressing progress of oxidation by virtue of surface stress, a very small average grain size is obtained.

Then, as illustrated in FIG. 20C, a variable resistance portion 40 is formed on the silicon oxide film 203, and an interconnect 20 is formed on the variable resistance portion 40. Thereby, the memory device of the twelfth embodiment is formed.

The smallest average grain size of the conductive minute particles (Si nanocrystals) in the multiple tunnel junction portion 30 can be controlled by changing the oxidation conditions. Since high energy barriers are formed by the Si nanocrystals having a very small minimum average grain size, the reverse bias current suppression effect of the multiple tunnel junction portion is improved, and excellent rectification is expected. In addition, since there is a nanocrystal layer 34 having a medium grain size to reduce the difference in average grain size between the adjacent Silicon nanocrystals, the forward current is improved, and more excellent rectification is expected.

[Others]

As described above, the memory devices according to the embodiments can perform writing, erasing, storage retention, and reading by application of a proper voltage, and the current, the resistance, and the voltage in each state can be designed based on the theory, by adjusting the tunnel resistance of the tunnel insulating film and the height of the energy barriers in the conductive minute particles, based on operation of only the variable resistance portion. Thereby, the memory characteristics can be designed by structure design of the thickness of the tunnel insulating films and the grain sizes of the silicon nanocrystals (silicon minute particles). Orthodox theory is well known as a theory of current/voltage characteristics in the case of including fine conductive minute particles satisfying the Coulomb blockade condition.

Although the first to eighth embodiments show the examples of using a reversible variable resistance portion such as a conductive-bridge element and a variable resistive element, another variable resistance portion may be used, as long as it is a two-terminal reversible variable resistance portion which can perform writing, erasing, storage retention, and reading by application of a proper operating voltage.

An effective area of the memory device (memory cell) in the first to eighth embodiments will be explained hereinafter. The memory devices of the embodiments can perform memory operation as long as at least one silicon nanocrystal exists in each nanocrystal layer. Thus, it is considered that the size of the memory device (memory cell) can be scaled down to several nanometers, which is the size of a conductive minute particle.

The following is explanation of some desirable conditions for achieving the effects of the above embodiments.

First, although each of the embodiments adopts silicon minute particle layers, energy barriers are formed by the confinement effect, and larger energy barriers are formed as the grain size is reduced, even when conductive minute particle layers of another material is used. Thus, the same effect is obtained.

The above embodiments use a tunnel through an energy level formed by confinement of carriers, in conductive nanoparticles, such as Si nanocrystals in the tunnel insulating film. Specifically, since no quantum-mechanical state exists in the energy range of the energy barrier $\Delta E$ in the conductive nanoparticle, when the energy barrier $\Delta E$ blocks traffic of carriers as in storage retention, there is no choice but going over the energy barrier $\Delta E$ in energy to pass through the energy barrier. The above embodiments use this structure. The effects of the embodiments can be efficiently exhibited when the energy barrier $\Delta E$ in the conductive nanoparticle is larger than heat fluctuation $k_B T$ ($k_B$ is the Boltzmann constant, T is the absolute temperature, $k_B T$ is about 26 meV at room temperature).

The energy barrier $\Delta E$ depends on the Coulomb blockade energy when the conductive nanoparticle is formed of metal material, and depends on the Coulomb blockade energy and the quantum confinement energy when the conductive nanoparticle is formed of semiconductor. The Coulomb blockade energy is one of main factors of the energy barrier $\Delta E$. When the conductive nanoparticle has a spherical shape or a shape close to a sphere, the self capacity of the conductive nanoparticle satisfies the expression "$C_{self}=2\pi\epsilon d$", when the grain size (diameter) is denoted by d. Thus, a tentative value of the Coulomb energy per electron is about "$q/C_{self}=q/(2\pi\epsilon d)$". Reference symbol q denotes an elementary charge, and $\epsilon$ denotes a dielectric constant of the material of the tunnel insulating film. In particular, the electrostatic energy for the first electron that enters the conductive nanoparticle is "$q/(2C\text{self})=q/(4\pi\epsilon d)$".

For example, a desirable range of the size d of the conductive nanoparticle can be estimated by using it. The grain size d of the conductive minute particles used in the present embodiment desirably satisfies "$q/(4\pi\epsilon d)>k_BT$", that is, "$d<d\text{max}=q/(4\pi\epsilon k_BT)$". When a typical tunnel insulating film is a silicon oxide film, dmax is 15 nm.

The tunnel insulating films (silicon oxide films) desirably have a small thickness. Since the rectification is improved by increasing the energy barriers by reducing the grain size of the silicon nanocrystals, the tunnel insulating film having a smaller thickness can more easily achieve low resistance in the forward direction. When the thickness of the tunnel insulating film is 2 nm or less, with which the tunnel insulating film itself has low resistance, excellent rectifying effect with low resistance in the forward direction is expected. When the thickness of the tunnel insulating film is 1.5 nm or less, the tunnel insulating film (silicon oxide film) itself has lower resistance, which is more desirable for achieving the effect of the embodiments. The lower limit of the thickness of the tunnel insulating film is, for example, 0.3 nm which is an interatomic distance, or 0.7 nm, which is a thickness of a natural oxide film in the atmosphere.

In addition, although all the above embodiments adopt silicon oxide films as the material of the tunnel insulating films, the embodiments can be carried out with another insulating film, as long as it has a tunnel resistance equal to that of silicon oxide films.

The tunnel insulating films (tunnel oxide films) formed of silicon oxide films can be set to desired thicknesses by designing the resistance and the current in the ON state. In the above embodiments, the resistance in the low-resistance state (ON state) depends on a higher one of the ON resistance of the variable resistance portion and the forward low-resistance of the asymmetric multiple tunnel junction portion. Thus, change in the low resistance in the forward direction of the asymmetric multiple tunnel junction portion obtained by adjusting the thickness of the tunnel insulating films can be used for design of the resistance and the current in the low-resistance state.

The silicon nanocrystal layer (for example, layer 34 in FIG. 1) having the smallest grain size in the first to sixth and eighth embodiments is required to have rectification in the forward and reverse directions, for example, as illustrated in FIG. 4A and FIG. 4B. Thus, the energy barriers are required to have a physically significant difference from the adjacent nanocrystal layer having a larger grain size. So, lower limits and upper limits of $\Delta E$ and $\Delta E1$ are required to satisfy "$\Delta E>\Delta E1+k_BT$".

The first limit of $\Delta E1$ is 0, since energy barrier should not block electrons when a voltage is applied in the forward direction, as illustrated in FIG. 4B. However, when $\Delta E1$ is too low, $\Delta E1$ has an energy state lower than both of $\Delta E$ and the interconnect when a voltage is applied in the forward direction, as illustrated in FIG. 16B. Thus, electric charges are accumulated in $\Delta E1$, the forward current decreases, and the rectification deteriorates.

To avoid the above situation, it is desirable that no energy relaxation occurs when ballistic electrons pass through $\Delta E1$ in application of voltage in the forward direction. Thus, supposing that d1 denotes the grain size (diameter) of the silicon nanocrystals included in the nanocrystal layer 32, the desirable thickness of silicon is 5 nm or less. Specifically, the upper limit of the grain size is defined as "$d1\leq 5$ nm". The Coulomb blockade energy in the above state is a more desirable lower limit of $\Delta E1$ ("$\Delta E1>q/(4\pi\epsilon\times 5\text{ nm})$"). The reference symbol $\epsilon$ denotes dielectric constant of the tunnel oxide film. As a desirable lower limit, $\Delta E1$ does not become lower than both of $\Delta E1$ and the interconnect in energy, when a voltage is applied in the forward direction. The expression "$\Delta E\times T1/(T1+T2)<\Delta E1$" satisfies the above condition, and serves as a more desirable lower limit. The condition "$\Delta E\times T1/(T1+T2)<\Delta E1$", which satisfies the condition that $\Delta E1$ does not become lower than both of $\Delta E$ and the interconnect in energy, is a desirable upper limit of $\Delta E$. When the condition "$d1<5$ nm" is satisfied, the ballistic electrons pass through the barrier $\Delta E1$, and thus the effect of the present embodiments is obtained even when $\Delta E$ is larger than it. However, when $\Delta E$ is too high, the lowest electric field "$\Delta E/(T1+T2)$", with which $\Delta E$ does not block the current when a voltage is applied in the forward direction, increases, and deterioration and breakage of the tunnel oxide films and silicon nanocrystals are promoted.

Since the maximum electric field applied to tunnel oxide films of a NAND flash memory is about 15 MV/cm, when the maximum electric field is used as a tentative allowable electric field, another upper limit is "$\Delta E/(T1+T2)<15$ MV/cm", that is, "$\Delta E<(T1+T2)\times 15$ MV/cm".

The desirable range between $\Delta E$ of the nanocrystal layer and $\Delta E1$ of the adjacent nanocrystal layer including the minimum grain size is as described above. As explained in the second embodiment, when there is difference $\epsilon 1$ between the work function of the metal that is the material of the interconnect and the electron affinity of silicon, the same discussion is applicable in consideration of the effective energy barriers "$\Delta E\text{eff}=\Delta E+\epsilon 1$, $\Delta E1\text{eff}=\Delta E1+\epsilon 1$" in consideration of the difference in energy. More general desirable upper limits and lower limits of $\Delta E$ and $\Delta E1$ are described as follows.

$$\Delta E\text{eff}>\Delta E1\text{eff}+k_BT$$

$$\Delta E1>q/(4\pi\epsilon\times 5\text{ nm})$$

$$\Delta E\text{eff}\times T1/(T1+T2)<\Delta E1\text{eff}$$

$$\Delta E\text{eff}<(T1+T2)\times 15\text{ MV/cm}$$

In the above conditions, the expressions "$\Delta E\text{eff}=\Delta E+\epsilon 1$, $\Delta E1\text{eff}=\Delta E1+\epsilon 1$" are satisfied. The reference symbols $\Delta E$ and $\Delta E1$ denote energy barriers obtained by the Coulomb blockade effect and the quantum confinement effect of the conductive minute particle layer having the smallest grain size and the adjacent conductive minute particle layer, respectively, $\epsilon 1$ denotes a difference between the electron affinity or work function of the conductive minute particle layer such as the silicon nanocrystal layer and the electron affinity or work function of the electron supply source to the asymmetric multiple tunnel junction portion when the forward voltage is applied, $\epsilon$ denotes a dielectric constant of the tunnel insulating film material which sandwiches the conductive minute particles, T1 denotes the effective tunnel oxide film thickness between the adjacent conductive minute particle layer and the electron supply source to the asymmetric multiple tunnel junction portion, and T2 denotes the effective tunnel oxide film thickness between the conductive minute particle layer of the smallest grain size and the adjacent conductive minute particle layer.

The four desirable conditions for the above energy barriers $\Delta E$ and $\Delta E1$ can be replaced with the grain sizes of the silicon nanocrystals (silicon minute particles) included in the nanocrystal layers. The grain size of the conductive minute particle layer having the smallest grain size is denoted by d, and the grain size of the adjacent conductive minute particle layer is denoted by d1. One condition is a condition "d1≤5 nm" which is necessary for ballistic electrons to pass through ΔE1. The other three conditions can be obtained by specific dependence between ΔE and the grain size. The above barriers ΔE and ΔE1 are energies obtained by the Coulomb blockade effect and the quantum confinement effect. For example, when the first Coulomb energy q/(4πεd) per electron is used as standard, the following relations are established.

$$q/(4\pi\epsilon d) > q/(4\pi\epsilon d1) + k_B T$$

$$d1 \leq 5 \text{ nm}$$

$$[q/(4\pi\epsilon d) + \epsilon 1] \times T1/(T1+T2) < q/(4\pi\epsilon d1) + \epsilon 1$$

$$q/(4\pi\epsilon d) + \epsilon 1 < (T1+T2) \times 15 \text{ MV/cm}$$

In the above expressions, although the Coulomb energy of the first electron in the conductive minute particles used as a standard of dependence of the energy barriers on the grain sizes, quantum confinement also contributes to the energy barriers, in the case of using semiconductor minute particles such as silicon nanocrystals. The ground-state energy of quantum confinement can be estimated to be about $h^2/(8 m_{eff} d^2)$ per direction. The reference symbol $m_{eff}$ is the effective mass of quantum confinement. The desirable grain size conditions can be easily determined, based on dependence of the energy barriers on the grain sizes in consideration of the quantum confinement ground-state energy for three directions. The desirable grain size conditions can easily be determined, based on dependence of the energy barriers on the grain sizes determined by adding the Coulomb energy for the first electron to the quantum confinement ground-state energy for three directions.

The following is explanation of a desirable range in the case where there is only one silicon nanocrystal layer and rectification is achieved only by asymmetry of the thicknesses of the both tunnel insulating films (silicon oxide films) which sandwich the silicon nanocrystal layer therebetween, as in the seventh embodiment.

The lowest electric field, with which the energy barrier ΔE does not block electric current in the forward direction, is ΔE/T1, with reference to FIG. 14A. The reference symbol T1 denotes a thickness of the tunnel insulating film (silicon oxide film) having the larger thickness. When the value of LE/T1 increases, deterioration and breakage of the tunnel insulating films and silicon nanocrystals are promoted. Since the maximum electric field applied to the tunnel insulating films in a NAND flash memory is about 15 MV/cm, one upper limit is "ΔE/T1<15 MV/cm", that is, "ΔE<T1×15 MV/cm", when the maximum electric field is used as the allowable electric field.

When the same electric field is applied in the reverse direction, the energy barrier which blocks electric current is "ΔE+ε2−(T2/T1) ΔE", with reference to FIG. 14C. The reference symbol T2 denotes a thickness of the tunnel insulating film (silicon oxide film) having the smaller thickness. The reference symbol ε2 denotes a difference between the electron affinity or work function of the conductive minute particle layer such as a silicon nanocrystal layer and the electron affinity or work function of the electron supply source located on the side of the thinner tunnel insulating film.

Thus, the current decreasing rate in the reverse direction is "exp[−((1−T2/T1)ΔE+ε2)/$k_B$T]×(R1/R2)". The reference symbols R1 and R2 denote tunnel resistances of the thicker and thinner tunnel insulating films, respectively. The condition "the current decreasing rate in the reverse direction is smaller than 1" is a requisite for achieving rectification, and provides the lower limit of ΔE. The tunnel resistance is proportional to "exp [4πTeff(2mHeff)$^{1/2}$/h]", based on the tunnel probability of quantum mechanics. The reference symbol m denotes an effective tunnel mass of the tunnel insulating film (silicon oxide film in the embodiment), Heff denotes the height of the tunnel barrier, Teff denotes the thickness of the tunnel insulating film, and h denotes Plank's constant. Since the expression "R1/R2=exp [4πT1(2mH)$^{1/2}$/h]/exp[4πT2 (2m{H+ε2})$^{1/2}$/h]" is established, the expression "[(1−T2/T1)ΔE+ε2]/$k_B$T>4πT1(2mH)$^{1/2}$/h]−4πT2(2m{H+ε2})$^{1/2}$/h" provides a desirable lower limit of ΔE. The reference symbol H denotes height of the tunnel barrier of the silicon oxide film from an end of a silicon conduction band.

The desirable range of the energy barrier ΔE of the nanocrystal layer in the seventh embodiment is as described above. As explained in the second embodiment, when there is difference ε1 between the work function of the metal that is the material of the interconnect and the electron affinity of silicon, the same discussion is applicable, in consideration of the effective energy barrier "ΔEeff=ΔE+ε1" in consideration of the difference in energy and the fact that the height of the tunnel barrier of the thicker tunnel insulating film is "H+ε1". More general desirable upper limit and lower limit of ΔE are described as follows.

$$\Delta Eeff < T1 \times 15 \text{ MV/cm}$$

$$[(1-T2/T1)\Delta Eeff+\epsilon 2]/k_B T > 4\pi T1(2m\{H+\epsilon 1\})^{1/2}/h - 4\pi T2(2m\{H+\epsilon 2\})^{1/2}/h$$

In the above conditions, the expression "ΔEeff=ΔE+ε1" is satisfied. The reference symbol ΔE denotes an energy barrier obtained by the Coulomb blockade effect and the quantum confinement effect of the conductive minute particle layer such as a silicon nanocrystal layer, and ε1 denotes a difference between the electron affinity or work function of the conductive minute particle layer and the electron affinity or work function of the electron supply source on a side of the thicker tunnel insulating film (silicon oxide film).

The two desirable conditions for the energy barrier ΔE can be replaced with the grain size of the silicon nanocrystals (silicon minute particles). The grain size of the conductive minute particles is denoted by d. The two conditions can be obtained by specific dependence between ΔE and the grain size. The above barrier ΔE is energy obtained by the Coulomb blockade effect and the quantum confinement effect. For example, when the Coulomb energy q/(4πεd) per first electron is used as standard, the following relations are established.

$$q/(4\pi\epsilon d)+\epsilon 1 < T1 \times 15 \text{ MV/cm}$$

$$[(1-T2/T1)(q/(4\pi\epsilon d)+\epsilon 1)+\epsilon 2]k_B T > 4\pi T1(2m\{H+\epsilon 1\})^{1/2}/h - 4\pi T2(2m\{H+\epsilon 2\})^{1/2}/h$$

The energy barriers ΔE and ΔE1 and grain sizes d and d1 of the silicon nanocrystals in the above discussion are distributed due to variations in the grain size, when there are a plurality of conductive nanoparticles. Thus, the conditions of achieving the effect in the case where there are a plurality of nanoparticles in the conductive nanoparticle layer are obtained by using average values as ΔE and ΔE1 and the grain sizes d and d1 in the above conditions.

Although in the above explanation, the grain sizes d and d1 of the conductive nanoparticles are defined as a diameter of particles having a spherical shape or a shape close to a sphere, actually they do not always have a shape close to a sphere. In the case where the particles have a spherical shape, the self capacity thereof for the diameter d is "Cself=2πεd", and the Coulomb energy per electron is determined by "q/Cself=q/(2πεd)". In the case where the shape of the conductive nanoparticles is not close to a sphere, the effective grain size d can be specified by "d=Cself/(2πε)" for the self capacity Cself determined in accordance with the shape of the conductive particles.

Although the above embodiments are made by using nanocrystal layers formed by heating thin a-Si films, it is possible to use another method of directly forming silicon nanocrystals by LPCVD at high temperature. However, in the case of using LPCVD, the silicon nanocrystals may be distributed in a discrete manner, and not always densely formed. When the surface density of the silicon nanocrystals in the Si nanocrystal layer in the tunnel insulating film is too low, sufficient effect is not obtained. Since electrostatic shield length in Si is about 10 nm, when there is at least one silicon nanocrystal in an area of 20 nm squares on the channel surface, almost all surface of the channel is influenced by the stacked structure of the Si nanocrystal, without being blocked by electrostatic shield, and the effect is expected.

In the memory devices of the embodiments, the rectifying function in the forward direction and the reverse direction of the bias voltage can be achieved by the asymmetric multiple tunnel junction structure, and each operating voltage and the current in each state can be designed and controlled by using the tunnel resistance and the energy barriers, which basically depend on the structural factors, that is, the thicknesses of the tunnel oxide films and the grain sizes of the Si nanocrystals. Thus, the variable resistance portion is only required to perform writing and erasing which change the resistance by application of the bias voltage, and perform storage retention in the ON state and the OFF state. Thus, desired memory characteristics can be more easily achieved in the memory devices.

As described above, according to the embodiments, it is possible to provide a two-terminal resistance change element structure, which can easily achieve writing and erasing which changes the resistance between the two terminals, storage retention in the ON state and the OFF state, a rectifying function between the forward direction and the reverse direction of the bias voltage, and control of the voltage and the current in each operating state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
    a first conductive layer and a second conductive layer;
    a variable resistance portion provided between the first conductive layer and the second conductive layer, and having one of a low-resistance state and a high-resistance state; and
    a first multiple tunnel junction portion provided between the first conductive layer and the variable resistance portion, and including first, second, and third tunnel insulating films, a first nanocrystal layer provided between the first and second tunnel insulating films and including first conductive minute particles, and a second nanocrystal layer provided between the second and third tunnel insulating films and including second conductive minute particles.

2. The memory device according to claim 1, wherein the variable resistance portion includes a metal layer that includes metal, and a resistance change layer, into which the metal is diffused, and thereby resistance of the resistance change layer is changed.

3. The memory device according to claim 1, wherein the variable resistance portion includes a first metal layer and a second metal layer, and a metal oxide layer provided between the first metal layer and the second metal layer.

4. The memory device according to claim 1, further comprising
    a buffer metal layer provided between the variable resistance portion and the first multiple tunnel junction portion.

5. The memory device according to claim 1, wherein resistance of the high-resistance state in the variable resistance portion is higher than resistance in a forward direction, in which electric current easily flows, in the first multiple tunnel junction portion.

6. The memory device according to claim 1, wherein
    the first multiple tunnel junction portion is formed by arranging the first tunnel insulating film, the first nanocrystal layer, the second tunnel insulating film, the second nanocrystal layer, and the third tunnel insulating film in this order on the first conductive layer, and
    the first conductive minute particles included in the first nanocrystal layer has an average grain size larger than an average grain size of the second conductive minute particles included in the second nanocrystal layer.

7. The memory device according to claim 6, wherein
    the first multiple tunnel junction portion includes a fourth tunnel insulating film, and a third nanocrystal layer provided between the third and fourth insulating films and including third conductive minute particles, and
    the third conductive minute particles included in the third nanocrystal layer has an average grain size smaller than an average grain size of the second conductive minute particles included in the second nanocrystal layer.

8. The memory device according to claim 1, wherein
    the first multiple tunnel junction portion is formed by arranging the first tunnel insulating film, the first nanocrystal layer, the second tunnel insulating film, the second nanocrystal layer, and the third tunnel insulating film in this order on the first conductive layer, and
    the first conductive minute particles included in the first nanocrystal layer has an average grain size smaller than an average grain size of the second conductive minute particles included in the second nanocrystal layer.

9. The memory device according to claim 8, wherein
    the first multiple tunnel junction portion includes a fourth tunnel insulating film, and a third nanocrystal layer provided between the third and fourth insulating films and including third conductive minute particles, and
    the third conductive minute particles included in the third nanocrystal layer has an average grain size larger than an average grain size of the second conductive minute particles included in the second nanocrystal layer.

10. The memory device according to claim 1, wherein "$\Delta E > \Delta E1 + k_B T$" is satisfied,
    in which $\Delta E$ denotes an energy barrier of one of the first and second nanocrystal layers, which has the smaller average grain size among the first and second conductive minute particles, $\Delta E1$ denotes the other of the first and second nanocrystal layers, $k_B$ denotes Boltzmann constant, and T denotes temperature.

11. The memory device according to claim 1, wherein "$(\Delta E+\epsilon 1)\times T1/(T1+T2)<\Delta E1+\epsilon 1$" is satisfied, in which $\Delta E$ denotes an energy barrier of one of the first and second nanocrystal layers, which has the smaller average grain size among the first and second conductive minute particles, $\Delta E1$ denotes the other of the first and second nanocrystal layers, T1 denotes an effective tunnel insulating film thickness between the other of the first and second nanocrystal layers and an electron supply source to the first multiple tunnel junction portion, T2 denotes an effective tunnel insulating film thickness between the first and second nanocrystal layers, and $\epsilon 1$ denotes a difference between electron affinity or work function of the first and second nanocrystal layers and electron affinity or work function of the electron supply source to the first multiple tunnel junction portion when a forward voltage is applied.

12. The memory device according to claim 1, wherein "$(\Delta E+\epsilon 1)<(T1+T2)\times 15$ MV/cm" is satisfied, in which $\Delta E$ denotes an energy barrier of one of the first and second nanocrystal layers, which has the smaller average grain size among the first and second conductive minute particles, T1 denotes an effective tunnel insulating film thickness between the other of the first and second nanocrystal layers and an electron supply source to the first multiple tunnel junction portion, T2 denotes an effective tunnel insulating film thickness between the first and second nanocrystal layers, and $\epsilon 1$ denotes a difference between electron affinity or work function of the first and second nanocrystal layers and electron affinity or work function of the electron supply source to the first multiple tunnel junction portion when a forward voltage is applied.

13. The memory device according to claim 1, wherein the first and second conductive minute particles satisfy a Coulomb blockade condition.

14. The memory device according to claim 1, further comprising:

a second multiple tunnel junction portion provided between the second conductive layer and the variable resistance portion, and including fourth, fifth, and sixth tunnel insulating films, a third nanocrystal layer provided between the fourth and fifth tunnel insulating films and including third conductive minute particles, and a fourth nanocrystal layer provided between the fifth and sixth tunnel insulating films and including fourth conductive minute particles.

15. A memory device comprising:

a first conductive layer and a second conductive layer;

a variable resistance portion provided between the first conductive layer and the second conductive layer, and having one of a low-resistance state and a high-resistance state; and a first double tunnel junction portion provided between the first conductive layer and the variable resistance portion, and including first and second tunnel insulating films, and a first nanocrystal layer provided between the first and second tunnel insulating films and including first conductive minute particles, wherein the first and second insulating films have different thicknesses.

16. The memory device according to claim 15, wherein the first double tunnel junction portion is formed by arranging the first tunnel insulating film, the first nanocrystal layer, and the second tunnel insulating film in this order on the first conductive layer, and the first tunnel insulating film has a thickness larger than a thickness of the second tunnel insulating film.

17. The memory device according to claim 15, wherein the first double tunnel junction portion is formed by arranging the first tunnel insulating film, the first nanocrystal layer, and the second tunnel insulating film in this order on the first conductive layer, and the first tunnel insulating film has a thickness smaller than a thickness of the second tunnel insulating film.

18. The memory device according to claim 15, wherein the first conductive minute particles satisfy a Coulomb blockade condition.

19. A memory device comprising:

a first conductive layer and a second conductive layer;

a variable resistance portion provided between the first conductive layer and the second conductive layer, and having one of a low-resistance state and a high-resistance state;

a first tunnel insulating film provided between the first conductive layer and the variable resistance portion; and first conductive minute particles arranged in the first tunnel insulating film, and having a grain size which increases from a side adjacent to the variable resistance portion toward a side adjacent to the first conductive layer.

20. The memory device according to claim 19, further comprising:

a second tunnel insulating film provided between the first conductive layer and the first tunnel insulating film;

a third tunnel insulating film provided between the first conductive layer and the second tunnel insulating film; and second conductive minute particles provided between the second and third tunnel insulating films, and having a grain size larger than a grain size of the first conductive minute particles.

21. The memory device according to claim 20, further comprising:

a fourth tunnel insulating film provided between the second tunnel insulating film and the first tunnel insulating film; and third conductive minute particles provided between the second tunnel insulating film and the fourth tunnel insulating film, and having a grain size smaller than a grain size of the second conductive minute particles and larger than the grain size of the first conductive minute particles.

* * * * *